United States Patent
Himmelhaus et al.

(10) Patent No.: US 8,586,142 B2
(45) Date of Patent: Nov. 19, 2013

(54) METHOD AND APPARATUS FOR PRODUCING SMALL STRUCTURES

(75) Inventors: Michael Himmelhaus, Tokyo (JP); Oliver Worsfold, Tokyo (JP); Conor D. Whitehouse, Tokyo (JP)

(73) Assignee: Fujirebio Inc., Tokyo (JP)

( * ) Notice: Subject to any disclaimer, the term of this patent is extended or adjusted under 35 U.S.C. 154(b) by 571 days.

(21) Appl. No.: 12/441,680

(22) PCT Filed: Sep. 21, 2007

(86) PCT No.: PCT/JP2007/069120
§ 371 (c)(1),
(2), (4) Date: Apr. 28, 2009

(87) PCT Pub. No.: WO2008/035818
PCT Pub. Date: Mar. 27, 2008

(65) Prior Publication Data
US 2009/0269558 A1 Oct. 29, 2009

Related U.S. Application Data

(60) Provisional application No. 60/826,483, filed on Sep. 21, 2006.

(51) Int. Cl.
*B05D 1/32* (2006.01)

(52) U.S. Cl.
USPC .......... 427/282; 427/248.1; 977/890; 977/893

(58) Field of Classification Search
None
See application file for complete search history.

(56) References Cited

U.S. PATENT DOCUMENTS

| 5,736,073 | A * | 4/1998 | Wadley et al. ............... 264/10 |
| 7,018,944 | B1 * | 3/2006 | Carnahan ..................... 438/736 |
| 2005/0224779 | A1 * | 10/2005 | Wang et al. .................... 257/9 |
| 2006/0046521 | A1 * | 3/2006 | Vaartstra et al. ............ 438/778 |

OTHER PUBLICATIONS

Milton Ohring, Chapter 12—Mechanical properties of thin films, Materials Science of Thin Films (Second Edition), Academic Press, San Diego, 2002, ISBN 9780125249751. Applicable pp. 744-750.*
Milton Ohring, Chapter 4—Discharges, plasmas, and ion-surface interactions, and Chapter 5—Plasma and Ion Beam Processing of Thin Films, Materials Science of Thin Films (Second Edition), Academic Press, San Diego, 2002, pp. 196, 197, and 216. ISBN 9780125249751.*
Office Action issued in corresponding European Patent Application No. 07828861.0, dated Apr. 12, 2012.
J. Rybczynski, et al., Large-Scale Periodic Patterns and Their Application for Growing Aligned Nanotube and Nanowire Arrays, Boston College, Dept. of Physics, Chestnut Hill, MA 02467, Proc. of SPIE vol. 60030Y-1, (2005).
Japanese Office Action corresponding to Japanese Patent Application No. 2009-512349, dated Sep. 12, 2012.

(Continued)

*Primary Examiner* — Christina Johnson
*Assistant Examiner* — Lisa Herring
(74) *Attorney, Agent, or Firm* — Sughrue Mion, PLLC

(57) ABSTRACT

The present invention relates to a method for producing small structures includes: depositing a mask on a surface of a substrate; and evaporating a source material under such evaporation condition performed at such pressure to form a layer onto both a shadowed surface area and a non-shadowed surface area of the mask and the substrate.

21 Claims, 22 Drawing Sheets

(56) References Cited

OTHER PUBLICATIONS

Fischer et al.; Submicroscopic pattern replication with visible light; J. Vac. Scl. Technol. (1981); pp. 881-885; vol. 19 No. 4.

Deckman et al.; Natural Lithography; Appl. Phys. Lett. (1982); pp. 377-379; vol. 41 No. 4.

Burmeister et al.; Colloid Monolayers as Versatile Lithographic Masks; Langmuir (1997); pp. 2983-2987; vol. 13.

Haginoya et al.; Nanostructure array fabrication with a size-controllable natural lithography; Appl. Phys. Lett. (1997); pp. 2934-2936; vol. 71 No. 20.

Choi et al.; Nanopatterned Magnetic Metal via Colloidal Lithography with Reactive Ion Etching; Chem. Mater. (2004); pp. 4208-4211; vol. 16.

Himmelhaus et al.; Self-assembly of polystyrene nano particles into patterns of random-close-packed monolayers via chemically induced adsorption; Phys. Chem. Chem. Phys. (2002); pp. 496-506; vol. 4.

Boneberg et al.; The Formation of Nano-Dot and Nano-Ring Structures in Colloidal Monolayer Lithography; Langmuir (1997); pp. 7080-7084; vol. 13.

Aizpurua et al.; Optical Properties of Gold Nanorings; Phys. Rev. Lett. (2003); pp. 057401/1-057401/4; vol. 90 No. 5.

Haynes et al.; Angle-Resolved Nanosphere Lithography: Manipulation of Nanoparticle Size, Shape, and Interparticle Spacing; J. Phys. Chem. B (2002); pp. 1898-1902; vol. 106.

Choi et al.; Particle Arrays with Patterned Pores by Nanomachining with Colloidal Masks; J. Am. Chem. Soc. (2005); pp. 1636-1637; vol. 127.

Frey et al.; Ultraflat Nanosphere Lithography: A New Method to Fabricate Flat Nanostructures; Adv. Mater. (2000); pp. 1515-1519; vol. 12 No. 20.

Wang et al.; Large-scale triangular lattice arrays of sub-micron islands by microsphere self-assembly; Nanotechnology (2005); pp. 819-822; vol. 16.

Wright et al.; Ultraflat Ternary Nanopatterns Fabricated Using Colloidal Lithography; Adv. Mater. (2006); pp. 421-426; vol. 18.

Okazaki et al.; A New Fabrication Technique and Current-Voltage Properties of a Au/LB/Au Structure; pp. 66-67, Intl. symposium on organic molecular elec. (2000).

Metzger et al.; Electrical Rectification by a Monolayer of Hexadecylquinolinium Tricyanoquinodimethanide Measured between Macroscopic between Macroscopic Gold Electrodes; J. Phys. Chem B (2001); pp. 7280-7290; vol. 105 No. 30.

International Search Report (form/PCT/ISA/201) for PCT/JP/2007/069120; filing date Sep. 21, 2006.

Written Opinion (form/PCT/ISA/237) for PCT/JP2007/069120; filing date Sep. 21, 2006.

Bullen et al.; $TiO_2$ Nanoparticle Arrays Prepared Using a Nanosphere Lithography Technique; Nano Letters (2002); pp. 739-745; vol. 2 No. 7.

Fujimoto et al.; High-Performance, Vertical-Type Organic Transistors with Built-In Nanotride Arrays; Adv. Mater. (2007); pp. 525-530; vol. 19.

Wang et al.; Nonlinear optical properties of periodic gold nanoparticle arrays; Applied Surface Science (2007); pp. 4673-4676; vol. 253.

Extended European Search Report corresponding to European Patent Application No. 07828861.0, dated Aug. 17, 2011.

D.M. Mattox, "Handbook of Physical Vapor Deposition (PVD) Processing", p. 288, (1998).

Shtein Max, et al., "Micropatterning of Small Molecular Weight Organic Semiconductor Thin Films Using Organic Vapor Phase Deposition", vol. 93, No. 7, pp. 4005-4008, (Apr. 2003).

* cited by examiner

PRIOR ART

[Scheme 1]

Step 1

Step 2

Step 3

Step 4

Step 4'

[Scheme III-(a)]

Step 1

Step 2

Step 2'

[Scheme III-(b)]

Step 3

Step 4

Step 4'

[Scheme IV]

Step 1

Step 2

Step 2'

[Scheme V]

Step 1

Step 2

Step 2'

(a)

$V_{int} = 0.5\ r^3\ (2 \sin 60° - 1)^2/\cos 30°$ (b)

$s = (2 \sin 60° - 1)\ r$

| Pressure\Gas | He: $10^{-5}$ mbar<br>$N_2$: $10^{-4}$ mbar | $5\times10^{-4}$ mbar | $1\times10^{-3}$ mbar |
|---|---|---|---|
| He |  |  |  |
| $N_2$ |  |  |  |

| Pressure \ Gas | Krypton | Argon |
|---|---|---|
| $1 \times 10^{-3}$ mbar |  |  |
| $5 \times 10^{-4}$ mbar |  |  |
| $1 \times 10^{-4}$ mbar |  |  |
| $1 \times 10^{-5}$ mbar |  |  |

| Pressure \ Gas | Nitrogen (N₂) | Helium |
|---|---|---|
| $1\times10^{-3}$ mbar |  |  |
| $5\times10^{-4}$ mbar |  |  |
| $1\times10^{-4}$ mbar |  |  |
| $1\times10^{-5}$ mbar |  |  |

| Rate (nm/s) | | |
|---|---|---|
| 0.05 |  |  |
| 0.15 |  |  |
| 0.30 |  |  |

METHOD AND APPARATUS FOR PRODUCING SMALL STRUCTURES

CROSS REFERENCE TO RELATED APPLICATIONS

This application is a National Stage of International Application No. PCT/JP2007/069120 filed Sep. 21, 2007, claiming priority based on U.S. patent application Ser. No. 60/826,483, filed Sep. 21, 2006, the contents of all of which are incorporated herein by reference in their entirety.

TECHNICAL FIELD

The present invention relates to a technology for producing small structures.

This application is based upon and claims the benefit of priority from the prior U.S. Provisional Patent Application No. 60/826,483 filed on Sep. 21, 2006; the entire contents of which are incorporated herein by reference.

BACKGROUND ART

Since the seminal works of Fischer and Zingsheim (U. Ch. Fischer & H. P. Zingsheim, J. Vac. Sci. Technol., Vol. 19, pp. 881-885, 1981) as well as Deckman and Dunsmuir (H. W. Deckman & J. H. Dunsmuir, Appl. Phys. Lett., Vol. 41, pp. 377-379, 1982) surface-adsorbed colloidal particles have found wide-spread application as large scale masks for nanopatterning. As illustrated in FIG. 1, the masks can either be used in an etching process, where they protect the underlying surface (see FIG. 1(a)), or for material deposition, where they allow the formation of additional features only in the interstices between neighboring particles (see FIG. 1(b)). In case of the etching process, usually a thin film 1 is formed on a solid substrate 2 (step 1). After deposition of the colloidal mask 3, the film 1 is structured in a destructive treatment 4, such as reactive ion etching. Then, only those areas of the film 1 are stable, which are protected by the colloidal mask 3 (step 2). In case of the deposition process, the colloidal mask 3 is disposed on the substrate 2 (step 1). Then the thin film 1 is built up during the deposition 5 through the interstices in the mask 3 (step 2). Those two techniques yield complementary patterns. This basic concept of the etching process and the deposition process has been applied and modified in a number of different ways, as outlined in the following.

Initially, the colloidal particles were deposited on surfaces to form hexagonally dense-packed structures and nanostructures were formed by material deposition via thermal evaporation through the instices between the particles (Fischer & Zingsheim, Deckman & Dunsmuir, F. Burmeister et al., Langmuir, Vol. 13, pp. 2983, 1997). Alternative approaches applied first an etching step to shrink the particle size in hexagonally dense-packed particle layers. Then, material was deposited via evaporation onto the non-shadowed regions of the surface, thereby forming mesh-like nanostructures (C. Haginoya et al., Appl. Phys. Lett., Vol. 71, pp. 2934-2936, 1997; D.-G. Choi et al., Chem. Mater., Vol. 16, pp. 4208-4211, 2004). Later, the use of colloidal particles as a lithographic mask has been widened to less densely and less regularly arranged particles. For an overview over standard deposition schemes and the resulting colloidal masks, cf. to Himmelhaus & Takei and the references therein (M. Himmelhaus & H. Takei, Phys. Chem. Chem. Phys., Vol. 4, pp. 496-506, 2002).

Boneberg et al. (J. Boneberg et al., Langmuir, Vol. 13, pp. 7080-7084, 1997) used the drying process of the colloidal suspension to form organic rings around the contact points of the spherical colloidal particles with the substrate by adding organic molecules to the suspension prior to drying. Aizpurua et al. (J. Aizpurua et al., Phys. Rev. Lett., Vol. 90, pp. 057401/1-4, 2003) used Argon ion beam etching to produce ring-like metal structures by first ablating the metal from the non-shadowed parts of the surface and then filling the shadowed area underneath the particles due to collisions with the Ar ions.

Van Duyne (C. L. Haynes et al., J. Phys. Chem. B, Vol. 106, pp. 1898-1902, 2002) utilized metal deposition onto colloidal masks at different deposition angles with respect to the surface to achieve differently formed nanostructures in the interstices of the colloidal masks.

Yang and coworkers (D.-G. Choi et al., J. Am. Chem. Soc., Vol. 127, pp. 1636-1637, 2005) used a dense-packed colloidal double layer for the fabrication of nanopores. A polystyrene (PS) latex suspension with an average particle diameter of 1 μm was mixed with a silica nanoparticle suspension with an average particle diameter of 50 nm. After deposition of the mixture onto a substrate and subsequent drying, a PS bead double layer embedded into a silica host matrix had formed. Subsequent steps of Reactive Ion Etching (RIE) led to bead removal and bead patterning as well as to the formation of silica nanopore structures.

Chilkoti and coworkers (W. Frey et al., Adv. Mater., Vol. 12, pp. 1515-1519, 2000) combined colloidal lithography on mica with a subsequent lift-off process to achieve ultraflat binary nanopatterns, lacking any topology despite of formation of the pattern. Such features are useful in all applications, where surface chemistry has to be properly distinguished from surface topology.

Ren and coworkers (Y. Wang et al., Nanotechnol., Vol. 16, pp. 819-822, 2005) used colloidal masks in combination with sputtering and evaporation deposition processes to form a complex secondary inorganic mask. The latter was then used for the preparation of triangular lattice arrays. This work is important because it discloses for the first time the difference between sputtering and evaporation onto convex-shaped particle layers.

In a recent work Himmelhaus and coworkers (J. Wright et al., Adv. Mater., Vol. 18, pp. 421-426, 2006) have utilized this difference between sputtering and evaporation in combination with the lift-off process as suggested by Chilkoti and coworkers to form ultraflat ternary patterns. The key to this technology is that sputtering coats the entire accessible substrate surface, leaving only those areas on the surface in direct contact with the colloidal particles uncoated, while evaporation coats only the non-shadowed regions. Accordingly, evaporation combined with subsequent sputtering forms a binary inorganic pattern on the substrate. Removal of the colloidal particles and backfilling of the residual apertures then yields the formation of a ternary structure, which becomes accessible via a subsequent lift-off process.

For deposition of inorganic materials, such as metals or metal oxides, mainly standard evaporation and sputtering processes have been applied as well known to those skilled in the art. However, Okazaki and Sambles (N. Okazaki & J. R. Sambles, *A New Fabrication Technique and Current-Voltage Properties of a Au/LB/Au Structure*, Extended Abstracts, Intl. Symposium on Organic Molecular Electronics, Nagoya, Japan, 18-19 May 2000, pp. 66-67) and later Peterson and coworkers (R. M. Metzger et al., J. Phys. Chem. B, Vol. 105, pp. 7280-7290, 2001) used metal evaporation at a base pressure much higher than usual (up to about $5 \times 10^{-3}$ hPa) to achieve soft landing of the evaporated metal atoms onto an ultrathin organic film. This was achieved by elevating the low base pressure of the evaporator in use (~$10^{-6}$ hPa) by means of argon. Prior to this, the substrate bearing the ultrathin organic film on one surface had been mounted inside of the evaporation chamber with the coated surface facing away from the evaporation source. Accordingly, only those metal atoms that were backscattered due to collisions with the argon atoms could be deposited on the organic film. Due to the low impact of the backscattered atoms, the organic film was not damaged during the deposition process. These activities aim at the fabrication of metal-organic film-metal sandwich layers for applications in molecular electronics.

DISCLOSURE OF INVENTION

The present invention has been achieved in order to solve the problems which may occur in the related arts mentioned above.

A method for producing small structures according to one aspect of the present invention, includes: depositing a mask on a surface of a substrate; and evaporating a source material under such evaporation condition performed at such pressure to form a layer onto both a shadowed surface area and a non-shadowed surface area of the mask and the substrate.

A product according to another aspect of the present invention is the product made by the method for producing small structures mentioned above.

An apparatus according to another aspect of the present invention, includes: a vacuum chamber in which a substrate having a mask onto a surface of the substrate is disposed; a heater that heats a source material to form a layer; and a vacuum unit that introduces such pressure to form a layer onto both a shadowed surface area and a non-shadowed surface area of the mask and the substrate.

BRIEF DESCRIPTION OF DRAWINGS

FIG. 1(a) shows the etching process applying colloidal masks as an etching mask, and FIG. 1(b) shows the deposition process applying colloidal masks as a deposition mask;

FIG. 2(a) shows evaporation process under high vacuum conditions, and FIG. 2(b) shows sputtering process at low vacuum conditions;

FIG. 3(a) is a scanning electron microscopy (SEM) image of the pattern, and FIG. 3(b) is a partially enlarged image of FIG. 3(a);

FIG. 17(a) is a side view of the mask and FIG. 17(b) is a plain view of the mask;

BEST MODE FOR CARRYING OUT THE INVENTION

Exemplary embodiments relating to the present invention will be explained in detail below with reference to the accompanying drawings.

First, basic concepts of the embodiments and the background of the concept are explained below.

Figure 1:
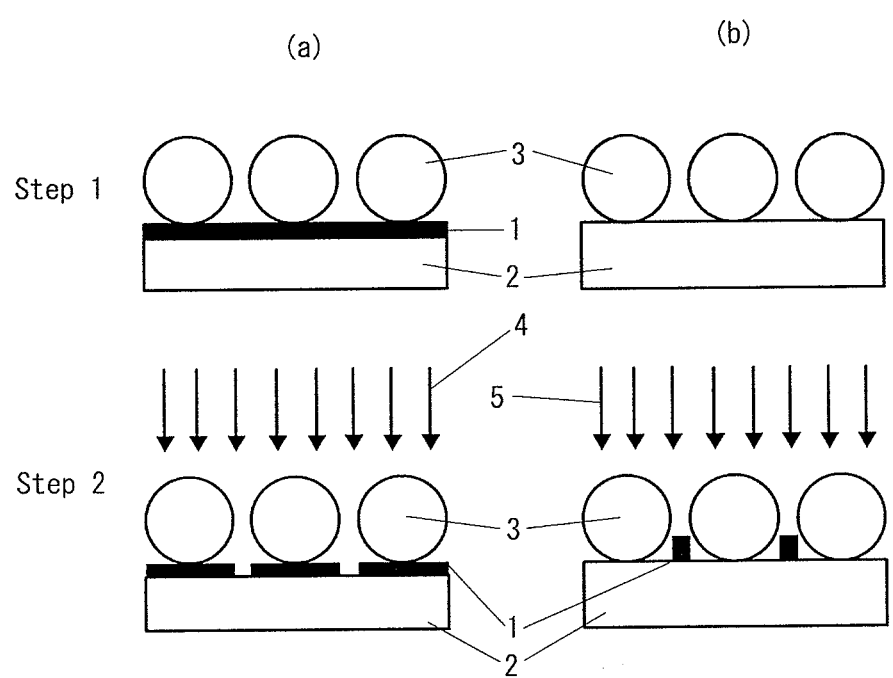
FIG. 1 is a schematic view that depicts typical applications of colloidal masks of the related art.
Figure 2:
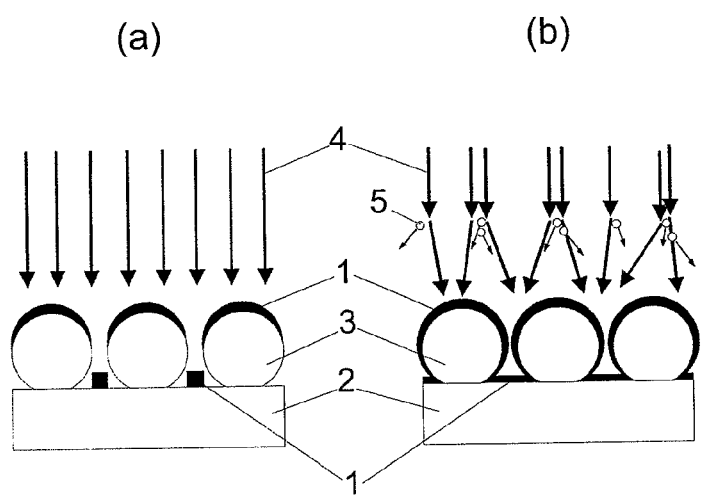
FIG. 2 is a schematic view that depicts an evaporation process and a sputtering process.

The novel fabrication technique presented in these embodiments for the production of complex small patterns, such as nanopatterns or micropatterns, of well-defined topography is based on the observation that evaporation and sputtering processes show a different deposition characteristics if used in combination with a colloidal mask made of convex particles. FIG. 2 is a schematic view that depicts evaporation process and sputtering process. As shown in FIG. 2(a), in the evaporation process, which is performed under high vacuum conditions with chamber pressures of typically<$10^{-5}$ hPa, collisions among the evaporated atoms 4 or between the evaporated atoms and the residual gas 5 in a chamber (not shown in FIG. 2) are rather unlikely. Therefore, the particle trajectories exhibit a strong directionality, which is only limited by the geometry of the apparatus, and a shadowing effect occurs such that only those areas of the total free area of the substrate 2 are coated with the evaporated material, which are in the direct line of sight with the evaporation source. Other free parts of the total area remain uncoated. In contrast, the vacuum in the sputtering process as shown in FIG. 2(b) is low, since the residual pressure inside of the chamber must allow for the plasma discharge process, which is essential in sputtering. In particular, the discharge process must be sufficiently intense to yield the wanted sputter rate, thereby setting a lower limit for the residual chamber pressure of typically $10^{-3}$ hPa to $10^{-1}$ hPa. Thus, collisions between sputtered atoms or clusters and the residual gas 5 are rather likely. These collisions widen the angular velocity distribution of the particles, causing the coating also of those areas of the total free surface, which are shadowed in a directed deposition process.

Therefore, if used in combination with a mask comprising convex elements, such as a colloidal mask formed of spherical particles, the substrate surface is coated to different extent by the two methods. In case of evaporation, only the non-shadowed surface area becomes coated, i.e. that in direct view of sight of the evaporation source. In contrast, if sputtering is applied, the entire free surface area becomes coated, i.e. in particular also those regions, which are not in direct view of sight with the sputtering target. The non-coated areas are limited to the contact points of the mask elements with the substrate and/or with each other, thus significantly reducing the size of the non-patterned structures, which can be formed from a convex mask element of given size.

Figure 3:
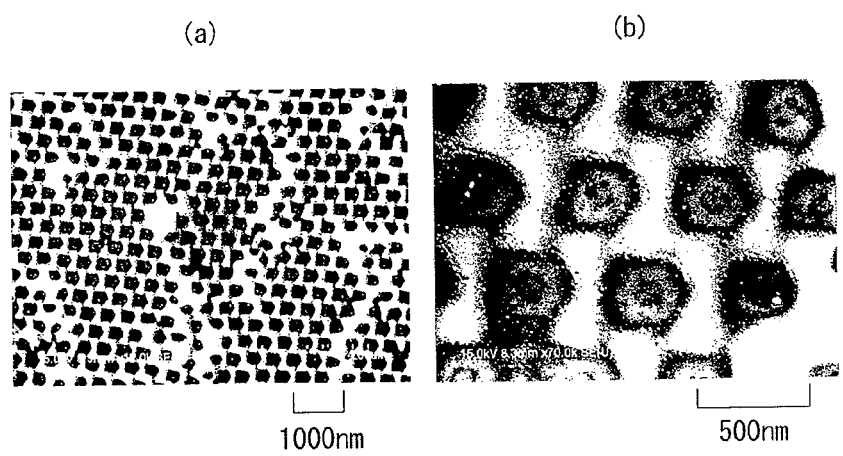
FIG. 3 is an image of a pattern produced by sputtering.

In recent work, the inventors of the present application have utilized the potential of these differences in the techniques successfully to fabricate ultraflat ternary nanopatterns on mica (Wright et al., Advanced Materials, Vol. 18, pp. 421-426, 2006). However surprisingly, when the inventors tried to use other substrates than mica, e.g. silicon wafers, the inventors found that the process of sputtering does not yield a clear contrast between coated and uncoated surface areas. The FEG-SEM image in FIG. 3(a) demonstrates a typical silicon sample, after bead removal, when metal is sputtered through a nanobead lithographic mask formed on a silicon wafer (50 nm of Ti were sputtered at a chamber pressure of $5 \times 10^{-3}$ hPa onto the mask of 500 nm polystyrene latex beads). A large scale interlocking metal mesh structure is clearly observed which is highly granulated in form. But in addition, metal is also deposited randomly within the poreholes as evident from the high magnification image shown in FIG. 3(b), thus restricting future applications in relation to selectively accessing the silicon substrate, e.g. by using self-assembled monolayer (SAMs) technology. Obviously, during the deposition process, material was allowed to creep underneath the colloidal particles, suggesting a poor adhesion of the colloidal mask to the substrate. The inventors assume that charging effects due to the presence of electrons and ions in the plasma and/or the relatively high chamber pressure cause such distortions. Further, the delamination of the colloidal mask might be favored on silicon as compared to mica due to poorer adhesion on the former.

To circumvent the problems related with sputtering, the inventors utilized evaporation at elevated chamber pressures by introducing pure nitrogen as a neutral inert gas, thereby increasing the collision frequency between metal atoms and the residual gas in the chamber with an aim to broaden the angular velocity distribution of the evaporated metal atoms. The obvious advantages of this approach are that an inert and uncharged gas can be used thus avoiding any free charge carriers and that there is no lower limit for the partial pressure of the added gas, since neither a plasma discharge condition has to be fulfilled nor a sputter rate needs to be adjusted. The gas pressure introduced only serves the purpose of widening the angular velocity distribution of the evaporated material. Therefore, the deposition rate can be chosen independently from the chamber pressure and pressure and/or deposition rate can be changed freely, even while the deposition is under progress. The gas used for this purpose is called "working gas" or "residual gas" in the following.

Figure 4:
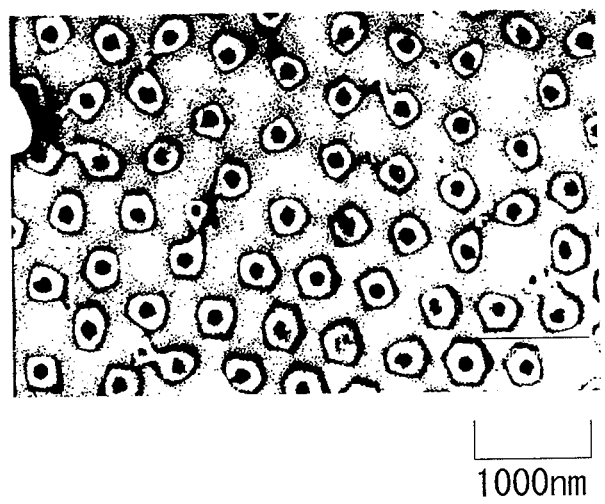
FIG. 4 is a SEM image of a pattern produced by evaporation according to the method disclosed here.

To verify that such gas-assisted evaporation may yield a coating similar to what is observed when using sputtering, the inventors deposited 20 nm of Cr onto a colloidal mask formed from 500 nm polystyrene particles beads on a silicon wafer in a nitrogen atmosphere. Pure nitrogen was used to raise the chamber pressure to $10^{-3}$ hPa. As shown in FIG. 4, a Cr mesh has formed similar to that found previously with sputtering (cf FIG. 3). Surrounding these pores is a raised region where Cr metal has piled up against the beads during the evaporation and prior to bead removal (cf also FIG. 5). This time, however, the contact points of the colloidal particles with the silicon substrate remain bare, as indicated by the dark dots in the centers of the hexagonal pattern.

Figure 5:
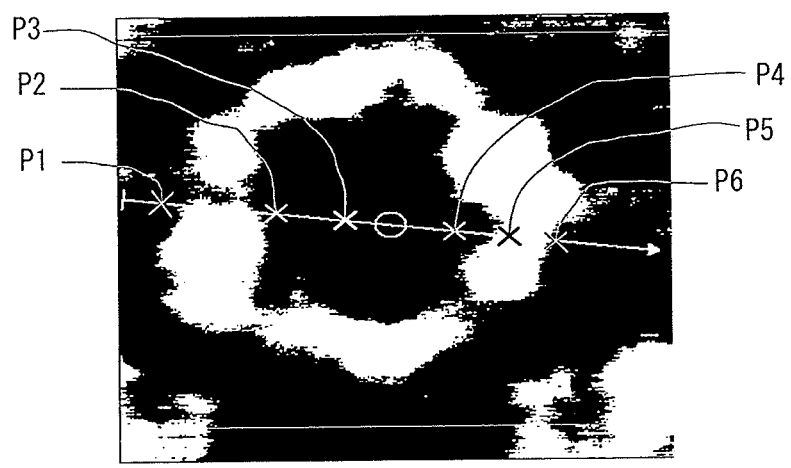
FIG. 5 is an image of a high resolution atomic force microscopy (AFM) scan of an individual ring structure as shown in FIG. 4.
Figure 6:
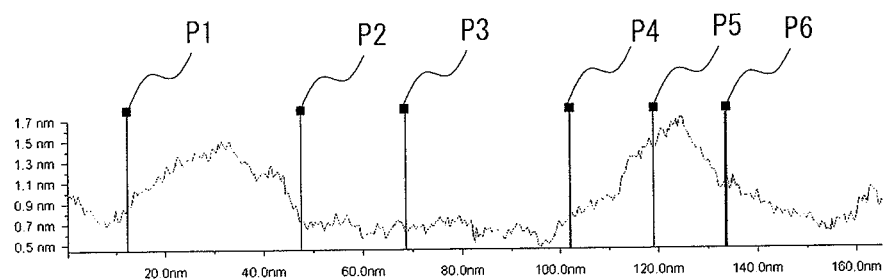
FIG. 6 is a graph showing the height profile of points P1 to P6 along a geometrical line across the ring structure shown in FIG. 5 as obtained from the AFM data.

FIG. 5 shows an image of a high resolution AFM scan of an individual ring structure as shown in FIG. 4, and FIG. 6 is a graph showing the height profile along a geometrical line across the ring structure as shown in FIG. 5. As displayed in FIGS. 5 and 6, the cleanliness of the substrate in the center hole can also be verified on the nanoscale by scanning across a single hole with an Atomic Force Microscope (AFM). The line profile in FIG. 6 reveals that the surface in the center of the pores is extremely flat and smooth, thereby ruling out the presence of unintentionally deposited material as in the case of sputtering (cf FIG. 3).

The method of gas-assisted evaporation described here uses the collisions between the atoms or molecules of an evaporated material and a host gas to coat the entire free surface area of a substrate of arbitrary shape. In contrast to other methods, like sputtering, there are much less restrictions on the parameters used, such as chamber pressure and selection of host gas. One particular advantage over sputtering is the lack of any charged ions or particles in the atmosphere, which prevents unwanted effects such as charging of the surface and repulsive interactions between the atoms or molecules in the gas phase and/or with the surface. Also, the parameters chosen can be freely varied throughout the process of evaporation, so that structures of different topology and/or chemical composition can be fabricated even from the same template. Since there is no need to remove the samples from the evaporation chamber for subsequent material depositions, the cleanliness of the overall process is significantly improved compared to evaporation with subsequent sputtering, where the sample typically has to be transferred between different instruments. Accordingly, also adhesion between adjacent layers can be improved, e.g. due to avoidance of air-borne contamination and/or built-up of oxide layers.

Examples 3-5 exemplify some of the advantages of the new method over traditional sputtering and demonstrate that a variety of small patterns can be prepared.

Based on the above observations, the inventors have perceived that also new ternary small structures can be produced by combining at least two evaporation processes at different pressures, respectively. A pumping system for producing such structures by combining at least two evaporation processes and a plurality of schemes for applications of the combined evaporation processes will be explained herein below.

Figure 7:
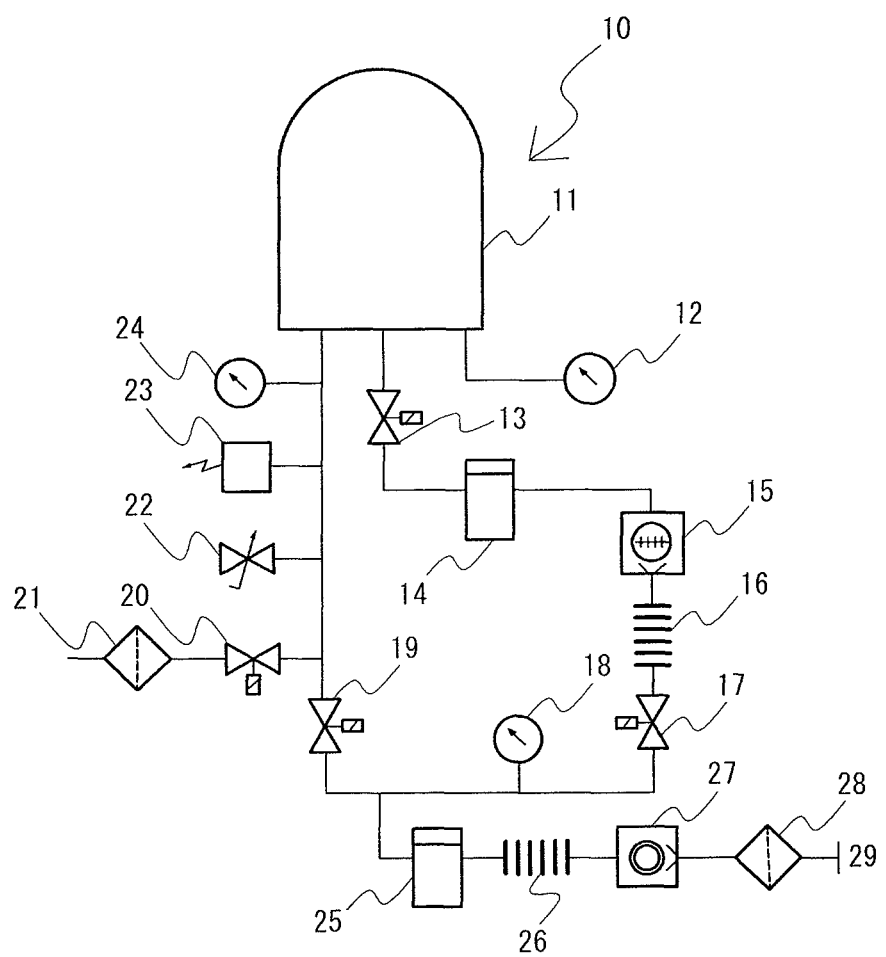
FIG. 7 is a schematic diagram that depicts a pumping system for producing small structures according to an embodiment of the present invention.

Basically, any standard evaporator can be utilized to produce small structures on the condition that at least two different pressures can be introduced to a chamber on which a substrate is disposed. FIG. 7 is a schematic diagram of the example pumping system. The pumping system 10 includes a vacuum chamber 11, a chamber pressure gauge 12, a high vacuum valve 13, a liquid nitrogen trap 14, a turbo molecular pump 15, a flexible connection 16, a backing valve 17, a backing pressure gauge 18, a roughing valve 19, a vent valve 20, a sinter filter 21, a needle valve 22, a vacuum interlock switch 23, a chamber pressure gauge 24, a foreline trap 25, a flexible connection 26, a rotary pump 27, an oil mist filter 28, and an exhaust outlet 29. The needle valve 22 is disposed for controlling the gas pressure inside of the vacuum chamber 11. The needle valve 22 must be capable of fine tuning the pressure in the required range, i.e. from about $10^{-7}$ to $10^{-1}$ hPa.

For operation of the pumping system 10, the vacuum chamber 11 is first opened to allow sample loading. Then, the chamber is closed. Also the high vacuum valve 13 and the backing valve 17 are closed to prevent the turbo molecular pump 15 from high pressure damage. Then, the roughing valve 19 is opened to connect the vacuum chamber to the rotary pump 27 via the foreline trap 25, which is used to filter oil and other contamination penetrating into the system, and the flexible connection 26. The oil mist filter 28 hinders pump oil to contaminate the laboratory air, the outlet 29 allows the air pumped by the rotary pump 27 to flow into the ambient. The rotary pump 27 achieves a pressure of about 0.1 hPa inside of the vacuum chamber 11. The chamber pressure can be monitored by the chamber pressure gauge 24. The vacuum interlock switch 23 gives signal to the control electronics that the system is now under vacuum. If the minimum pressure is reached, the roughing valve 19 is closed and the high vacuum valve 13 and the backing valve 17 are opened. The chamber is now connected to the turbo molecular pump 15, which is backed against atmospheric pressure by means of the rotary pump 27, the opened backing valve 17, the foreline trap 25, and the flexible connections 16 and 26. The pressure gauge 18 is used to control the backing pressure. The turbo molecular pump system evacuates the chamber pressure down below $10^{-6}$ hPa. This process can be accelerated by freezing out of contamination, such as water, which is difficult to pump. For this, the liquid nitrogen trap 14 can be filled with liquid nitrogen and cooled down to a temperature of ~-196 Celsius. The chamber pressure gauge 24 is not sensitive enough to measure very low pressures. Therefore, the more sensitive gauge 12 has to be turned on now (before it was turned off to prevent it from high pressure damage). After the base pressure of the system of typically<$10^{-6}$ hPa has been reached, the system can be used for evaporation deposition. If a higher chamber pressure is wanted, the needle valve 22 can be carefully opened to allow an inert gas, which has to be connected to the valve's inlet, to flow into the chamber at a very low flow rate. The chamber pressure is now a delicate balance between flow in through the needle valve and flow out through the turbo molecular pump system. The upper pressure limit is therefore given by the damage limit of about $10^{-1}$ hPa of the turbo molecular pump system. After film deposition, the gauge 12 is turned off, the high vacuum valve 13, the roughing valve 19, and the needle valve 22 are closed and the vent valve 20 is opened to vent the chamber until atmospheric pressure is reached. The sinter filter 21 filters the air before going into the chamber to avoid contamination of the system with dust particles. After the chamber has reached atmospheric pressure, it can be opened and a new cycle may begin.

In the following, the inventors give example schemes for the most important applications of the novel method beyond the binary patterns given in examples 3-5, starting from simple ternary patterns to more complex systems. For clarity and simplicity, the masks comprising convex elements are made of spherical colloidal particles in the examples given below. However, any other kind of mask comprising convex elements would work accordingly and yield analogous results.

Basic Schemes (I) and (II)

Figure 8:
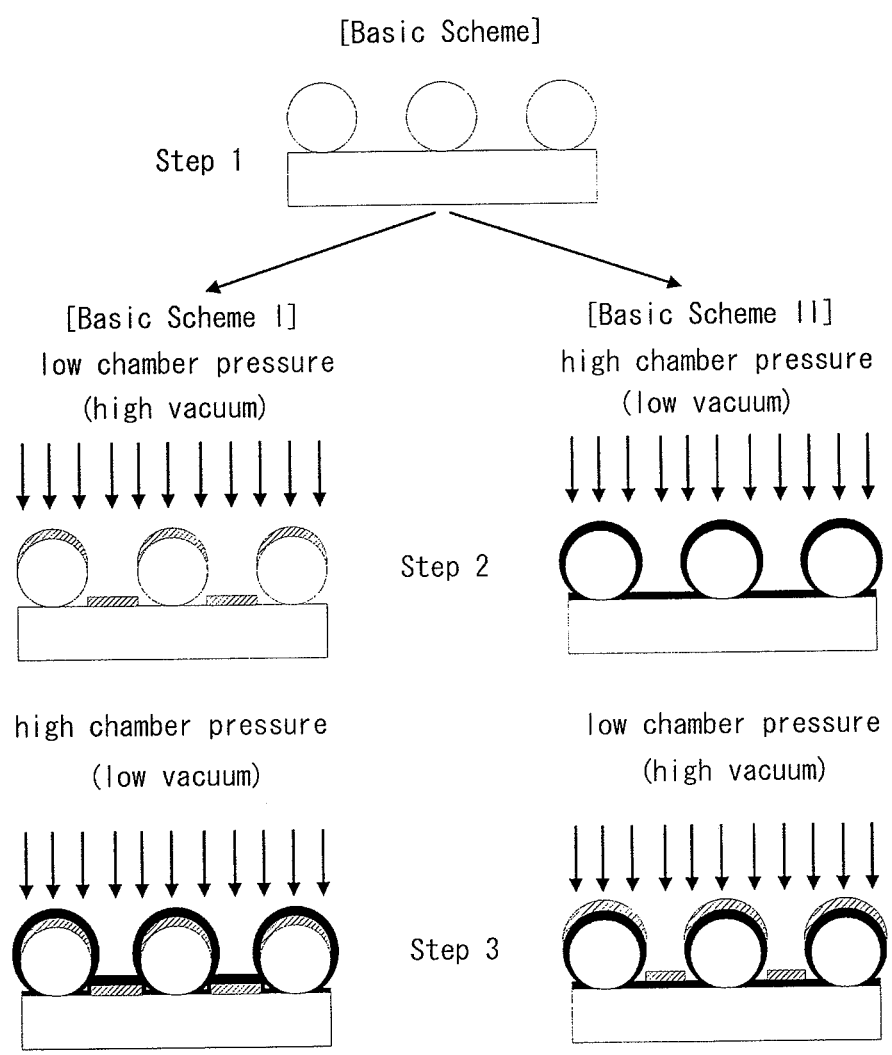
FIG. 8 is a schematic view that depicts basic schemes (I) and (II) to fabricate small patterns according to the embodiment of the present invention.

The most straightforward application of gas-assisted evaporation to small patterning beyond deposition of a single material is the deposition of two different materials onto a colloidal mask at two different chamber pressures, respectively. As illustrated in FIG. 8, there are two choices, since either the first or the second evaporation can be performed under lower pressure than the second or first one, respectively. In a basic scheme (I), after colloidal particles are disposed as a mask on a substrate (step 1), the first evaporation is performed under low chamber pressure, i.e. high vacuum conditions (step 2). Accordingly, the material is deposited only within the interstices that are directly accessible by the flow of non-scattered evaporated atoms or molecules. In a subsequent step, a second material is deposited at an elevated chamber pressure, thereby causing scattering of the evaporated atoms or molecules, which in turn coat the entire free surface area of the sample (step 3). Alternatively, in a basic scheme (II), the first evaporation can be performed at high chamber pressure, thereby coating the entire free surface area with the deposited material (step 2). Subsequently, a second material is deposited under vacuum conditions sufficiently high to avoid scattering of the material, yielding a different deposition characteristics (step 3). It is self-evident from the illustrations in FIG. 8 that the basic scheme (I) requires a removal of the substrate and/or the template particles to make the small structure accessible from the outside, while the basic scheme (II) can be used without such removal.

These two basic schemes (I) and (II) can be combined and subsequently applied in arbitrary manner to produce more complex small structures as explained in the following.

FIGS. 9 to 12 illustrate different example schemes (I) to (IV) of expanding above basic schemes (I) and (II) to the fabrication of more complex small patterns. All of them, except for schemes (IIIa) and (IV), depend on removal of the substrate used as template together with the colloidal particles for the deposition process.

Scheme (I)

Figure 9:
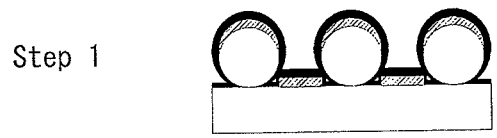
FIG. 9 is a schematic view that depicts scheme (I) to fabricate small patterns applying the basic schemes as shown in FIG. 8 according to the embodiment of the present invention.
Figure 9:
Figure 9:
Figure 9:
Figure 9:
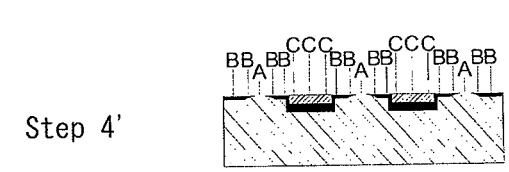

Scheme (I) in FIG. 9 shows the fabrication of a ternary pattern by successive material deposition according to the basic scheme (I) shown in FIG. 8. After the basic scheme (I) (step 1), the colloidal mask is removed (step 2), then a substrate attached from the top (step 3). Subsequently, the former substrate is lift-off and the ultraflat ternary pattern obtained selectively functionalized with organic materials (step 4, step 4') (In FIGS. 9 to 14, reference numbers A, B and C (and D in FIG. 13) denote the different surface modifications, i.e. the organic molecules). The resulting structure is similar to what the inventors achieved in recent work using a combination of sputtering and evaporation (Wright et al., Adv. Mater. 2006), however, now it can be applied to a wider range of materials. For the deposition thickness of the first material the same restriction holds as already discussed in Wright et al., i.e. the deposition thickness D should not exceed D=30% R, where 2 R is the diameter of the particles used as colloidal mask. In contrast to the work described in Wright et al., there is no need to expose the surface to the ambient between the two subsequent deposition steps. Accordingly, oxidation, contamination or any other degradation of the first layer, which can occur during an even short exposure to the ambient, can now be avoided. Therefore, adhesion between the two deposited materials as well as the cleanliness of the overall process is improved.

Scheme (II)

Figure 10:
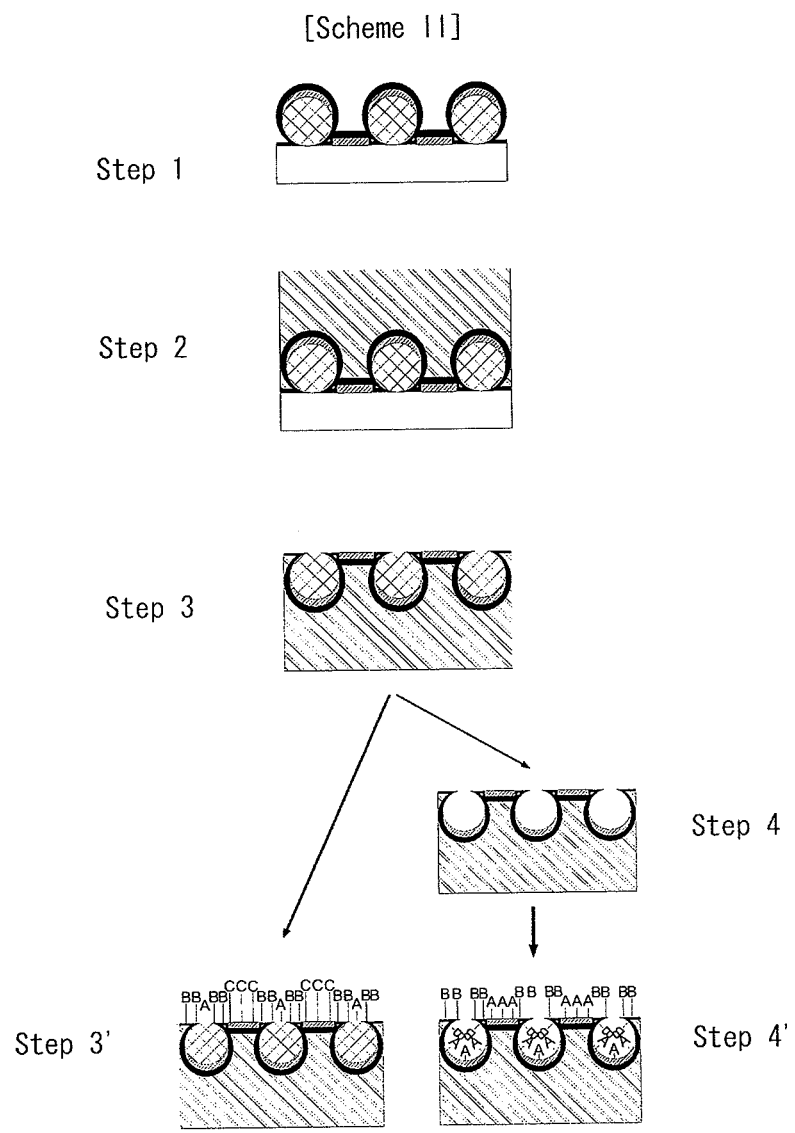
FIG. 10 is a schematic view that depicts scheme (II) to fabricate small patterns applying the basic schemes as shown in FIG. 8 according to the embodiment of the present invention.

Scheme (II) shown in FIG. 10 illustrates the fabrication of small pores, such as nanopores, where the interior surface of the pores consists of two different materials. Therefore, in a subsequent process of selective functionalization, e.g. via selective self-assembly, which utilizes the selective affinity of different organic molecules to the two materials of the pattern, the pores can be functionalized with two different organic molecules. For example, it can be desirable to have biological receptor molecules grafted to the bottom of the pore, while molecules regulating the access to the inner pore volume are grafted around the pore entrance. The fabrication is as follows. After the basic scheme (I) (step 1), a host material is placed on top of the colloidal mask, thereby embedding the colloidal particles (step 2). In a subsequent lift-off process, the former substrate is removed (step 3). Then, the colloidal particles are removed, e.g. by dissolving them in a suitable solvent or etchant, leaving open pores in the matrix material, which consist of the two deposited materials on top and bottom, respectively (step 4). Subsequently, the two materials can be (bio-)functionalized, e.g. by using selective self- assembly (step 4').

Alternatively, the colloidal mask can be retained in the surface and directly be (bio-)functionalized (step 3'). This might be desirable, for example, to obtain a ternary pattern on the surface, or in the case that the colloidal particles form optical cavities, which might be used for optical sensing of specific binding events. The material caps buried underneath of the colloidal particles might then be used e.g. as resonators for amplification of the desired optical properties.

Scheme (III)

Figure 11:
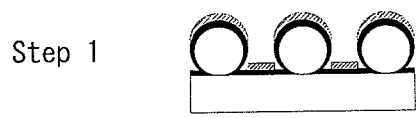
FIG. 11 is a schematic view that depicts scheme (III) to fabricate small patterns applying the basic schemes as shown in FIG. 8 according to the embodiment of the present invention.
Figure 11:
Figure 11:
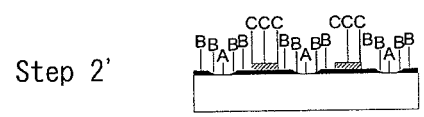
Figure 11:
Figure 11:
Figure 11:

Scheme (III) shown in FIG. 11 utilizes the reversed deposition sequence, i.e. basic scheme II (step 1). In scheme (IIIa) this structure is used to form a topologically structured surface after removal of the colloidal mask, which can be selectively functionalized, e.g. via selective self-assembly (step 2, step 2'). In scheme (IIIb), the topologically elevated structure is embedded into a host matrix after removal of the colloidal mask (step 3). Then, an ultraflat surface is obtained after lift-off of the structure from the former substrate (step 4). The surface exhibits a binary pattern in this case, while a third material (i.e. the material deposited under high vacuum conditions) is buried underneath the firstly deposited material (step 4'). The latter might be used e.g. as an optical or magnetic resonant structure without any direct exposure to the ambient.

Scheme (IV)

Figure 12:
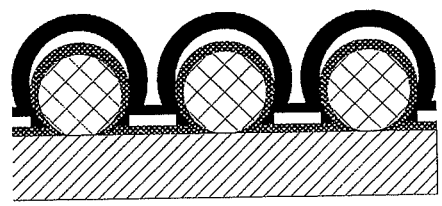
FIG. 12 is a schematic view that depicts scheme (IV) to fabricate small patterns applying the basic schemes as shown in FIG. 8 according to the embodiment of the present invention.
Figure 12:
Figure 12:
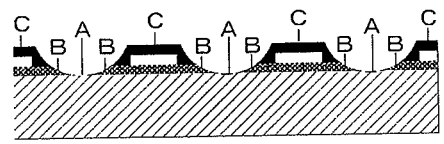
Figure 13:
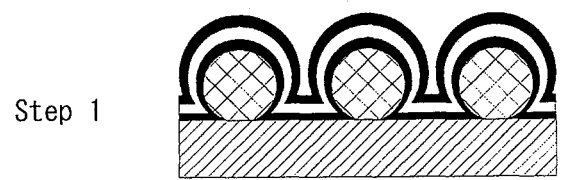
FIG. 13 is a schematic view that depicts scheme (V) to fabricate small patterns according to the embodiment of the present invention.
Figure 13:
Figure 13:

Scheme (IV) shown in FIG. 12 utilizes several (shown: three) deposition steps under low vacuum and high vacuum conditions. After the basic scheme (II) as shown in FIG. 8, the third material is deposited under low vacuum (step 1). After removal of the colloidal mask (step 2), a topologically elevated structure is formed that can be selectively functionalized (step 2'). (In FIG. 12, reference numbers A, B, and C denote the organic surface functionalizations of substrate, first material, and third material, respectively, while the second material remains non-functionalized, because it is encased by the first and third material).

Scheme (V)

The following two schemes (V) and (VI) are performed by several (one or more; shown three) deposition steps under the same (shown low) vacuum. Scheme (V) shown in FIG. 13 utilizes three deposition steps under low vacuum (step 1) that lead to the formation of well structures consisting of different materials after removal of the beads (step 2). Similar to scheme (IIIa), a topologically elevated structure is obtained (step 2'). (In FIG. 13, reference numbers A, B, C, and D denote the organic surface functionalizations of substrate, first material, second material, and third material, respectively).

Scheme (VI)

Figure 14:
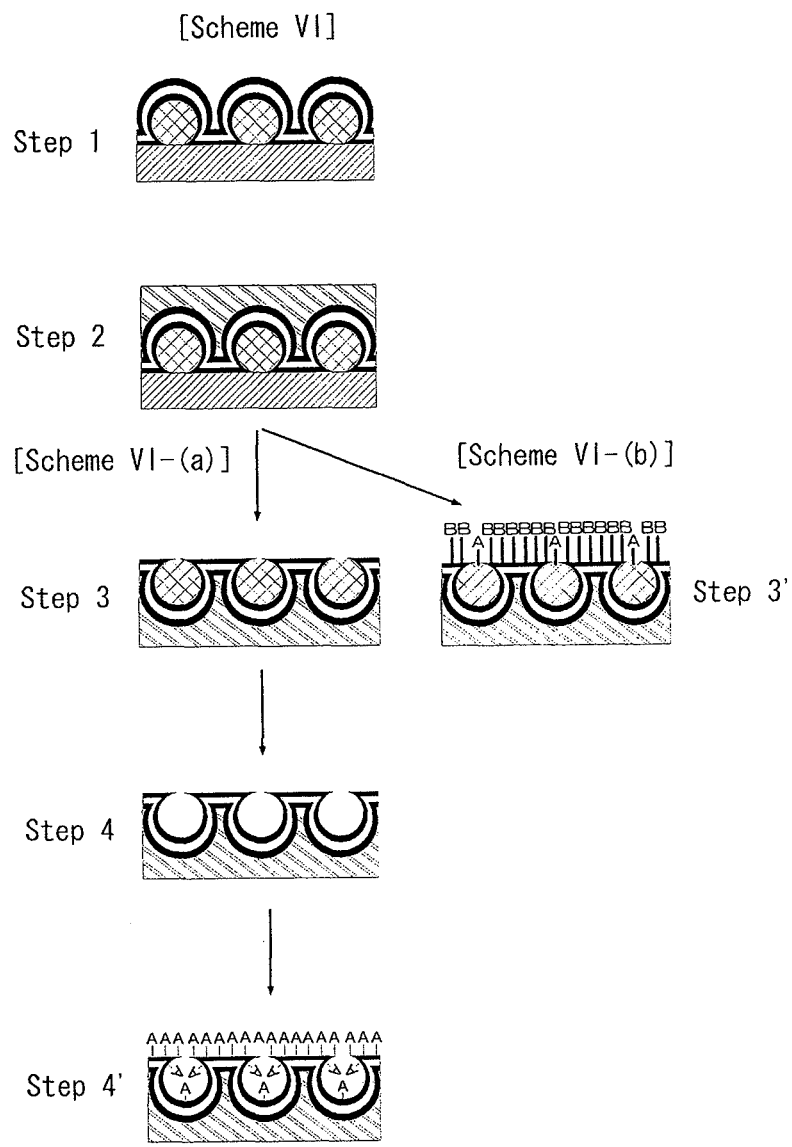
FIG. 14 is a schematic view that depicts scheme (VI) to fabricate small patterns according to the embodiment of the present invention.

Scheme (VI) shown in FIG. 14 combines the structure formed in scheme (V) during the deposition of one or more materials with a subsequent lift-off process (step 1). Thereby, the colloidal mask is embedded into a host material of adequate thickness (step 2), then the former substrate is removed (step 3). In scheme (VI-b), the resulting flat surface is functionalized with organic molecules, e.g. via selective self-assembly (step 3'). (In step 3' of FIG. 14, reference numbers A and B denote the organic surface functionalizations of colloidal mask and first material, respectively). In scheme (VI-a), the particles are removed (step 4), thereby forming pores in the host material of the colloidal mask. The surface of the inner walls of these pores consist of a single material, which was deposited as first material onto the colloidal mask. Accordingly, the free surface of the structure can be functionalized only with a single molecule (step 4'). (In step 4' of FIG. 14, reference number A denotes the organic surface functionalization of the first material). The structure buried underneath the cores may exhibit particular optical or magnetic properties to allow sensing of biomolecular events or to facilitate the attraction of (bio-) molecules or particles into the interior of the pores.

Materials and conditions that can be applied:

Regarding substrate, there is no specific restriction to the substrate, except for general limitations concerning usage in evaporation systems, such as the vacuum conditions and high temperature of the filament. Accordingly, the substrate should not show major outgassing at the required vacuum conditions, nor melting due to the infrared radiation originating from the filament used for evaporation. Also, the substrate should be compatible with the formation of a colloidal mask. Further, in the case of schemes (I), (II), (IIIb), and (VI), it should allow for a removal of the substrate in the desired process step. In practice, the substrate can be a metal, such as a transition metal, aluminium, or the like. It may be a semiconductor, such as a silicon wafer, germanium wafer, or III-V or II-VI composite semiconductor wafer (such as gallium arsenide or the like). Also, non-conducting inorganic and organic materials, for example mica or plastics, such as polymethacrylate (PMMA), polyethylene, polystyrene, or other plastics that can be coated with metal films in a evaporation deposition can be applied.

Regarding the mask, any mask suitable for the process conditions and comprising a convex element can be used. "Convex element", in this context means that a lateral structure formed by the mask has its maximum lateral extension not in immediate contact with the substrate, but at a non-zero height above the substrate. Then, a part of the free surface of the substrate, i.e. the surface not in immediate contact with the mask, is shadowed by the mask in a directed deposition process. A mask as used with the present embodiment should comprise such convex elements at least at some locations of the substrate.

For example, photoresist masks as used in standard photolithographic micro- and nanostructuring may be used as masks of the present embodiment, if they exhibit a certain under-etching of the lateral structures formed. To produce under-etched structures a number of techniques known by those skilled in the art may be applied. Other suitable masks may be prepared for example by non-isotropic etching, e.g. in silicon. Further, electrochemical deposition may be used to form masks comprising a convex element, e.g. by overgrowth of the deposited material over a removable mask of finite height. In a preferable embodiment, colloidal particles may be used as mask, because they exhibit naturally a convex element due to their typically spherical shape. By means of colloidal particles, the formation of masks comprising a convex element thus is particularly simple and straightforward even for masks of large lateral extension in the millimeter to centimeter regime. Therefore, in the examples given below, colloidal masks will be used as working examples. In practice, any of the commercially available colloidal suspensions, such as polymer latexes, or silica or titania suspensions can be used. As polymers, typically polystyrene, melamine resine, polymethylmethacrylate (PMMA), polyimide, and photo- and electron beam-resists may be used. Further the colloidal particles may consist of or be composed of block-copolymers, micelles and/or biomolecules, such as proteins. Further, the masks also may contain a dye or another fluorophore, such as a semiconductor quantum dot or a carbon nanotube, or a metal cluster.

Although the examples presented in the following were performed with colloidal masks composed of colloidal particles with sub-micron dimension, not only nanoparticles but also other small particles, such as microparticles whose diameter is about 50 to 100 µm or even more than 100 µm, can be used. It depends on the application as to whether what structure sizes are better suited. The same holds for other suitable masks, such as the photolithographic, silicon, or electrochemical masks mentioned above. The feature size of an individual structure needs not to be in the sub-micron regime. In case of the pores, for example, it is easier to achieve significant diffusion of (bio-) molecules into the pores, if the pore size is above 1 micron. On the other hand, control of the flux into the pores by functionalization with (bio-) molecules at the entrance (according to FIG. 10, step 4'), works better on the nanoscale, since this scale fits the dimension of the (bio-) molecules. Therefore, both regimes will be of relevance. In general, the nano regime will always be advantageous if the application needs to fit the dimension of the (bio-)molecules involved. This can be the case for biochemical access control of the pores, for oriented immobilization of (bio-)molecules, for the fabrication of artificial cell membranes and cell compartments, and for cell attachment, cell growth, cell control, transmembrane function, and cell harvesting. Further, from the aspect of an application of the method described here to the fabrication of an detecting element, in particular for a device for medical use, there is a demand to construct such a device by utilizing a smaller detector. For example, a diagnostic device for analysis of a specimen from a patient would have an advantage, if it could work with a smaller amount of specimen, thereby reducing a possible damage to the patient.

Regarding a deposited material, any material that can be used in a evaporation deposition process, as known by those skilled in the art, can be used. In practice, transition metals, aluminium, metal oxides, semiconductors, semiconductor oxides can be used. In particular, coinage metals, such as gold, silver, and further magnetic metals, such as nickel, cobalt, and iron will be of interest. Of the oxides, silicon oxide, germanium oxide, and titanium oxide will be preferably used.

Regarding scatter gas, any gas inert under the conditions of the evaporation process is feasible. While mostly nitrogen will be applied, it might be helpful to play with the molecular weight of the gas and thus to change its impact during the collisions. Therefore, any other type inert gas, like the noble gases, preferably helium, argon, krypton, and xenon, may be of interest. Gases with higher atomic mass may be better suited than other gases.

Concerning an upper limit of the pressure range of the higher pressure during evaporation, $10^{-1}$ hPa is a safe upper limit, because the deposition rate is very low at this pressure due to high scattering. Also, the turbo pumping system should not be operated at this level. However, it might be possible to replace the turbo pumping system by a different pumping system or to bypass the turbo pumping system during the deposition process. The lower and upper pressure limits can be led from a simple calculation. The density of the residual gas inside the chamber is given according to the ideal gas law as $$n = \frac{p}{k_B T},$$

where n is the number of molecules per unit volume, p is the pressure inside of the chamber, $k_B$ is the Boltzmann constant, and T the temperature of the gas inside of the chamber. The number of collisions z that an evaporated atom departing from the evaporation source undergoes on average until it deposits onto the substrate is simply $$z = n\, L\, \sigma,$$

where L is the distance between evaporation source and substrate used for deposition, and $\sigma$ is the so-called "collision cross-section". The collision cross-section can be calculated from the atomic or molecular radii of the colliding atoms or molecules according to $$\sigma = 2\pi(r^2_{ev} + r^2_{res}),$$

where $r_{ev}$ is the atomic radius of the evaporated material, and $r_{res}$ is the atomic or molecular radius of the residual gas inside of the chamber. With the molecular radius for nitrogen $r_{N2} = 1.87 \times 10^{-10}$ m and the atomic radius of a typical transition metal of $r_{met} = 1.65 \times 10^{-10}$ m, we obtain the following numbers of collisions z for different pressures (T=298K, L=0.3 m):

TABLE 1

| Pressure (hPa) | 1 | 0.1 | $10^{-2}$ | $10^{-3}$ | $10^{-4}$ | $10^{-5}$ |
|---|---|---|---|---|---|---|
| Number of collisions z | ~2500 | ~250 | ~25 | ~2.5 | ~0.25 | ~0.025 |

Table 1 clarifies that from a pressure range of $10^{-5}$ hPa and below collisions between evaporated atoms and the residual nitrogen molecules inside of the chamber are rather unlikely. Therefore, the deposition is limited to those areas on the substrate surface, which lie in the direct line of sight with the evaporation source. Also the upper limit of the pressure range can be seen from the table. At a pressure of 1 hPa, there are so many collisions on the way between evaporation source and substrate—each of them causing a change of propagation direction of the atom—that it is very unlikely that the atom reaches the substrate at all. Therefore, a reasonable upper limit for the pressures to be applied is somewhere between $10^{-2}$ and $10^{-1}$ hPa. Note that this simple estimation neglects any increase in the length of the travel path of the evaporated atoms from the source to the substrate due to the scattering events. Because of the latter, the total travel path may become much larger than L and thus further increase the probability for even further collisions. Thus the estimation given here is a safe upper limit for the upper pressure limit.

As mentioned above, the pressure can be changed arbitrarily, even while the deposition is under progress. Namely, each evaporation step of each scheme can be performed at not only one pressure but also a plurality of pressures. In other words, each evaporation condition to form each layer can be performed under at least one pressure.

EXAMPLE 1

Collision Between Two Hard Spheres

The collisions that occur between the evaporated atoms of the source material and the atoms or molecules of the working gas used to set the wanted pressure in the evaporation chamber during the deposition can be described within the framework of scattering theory. Since the collision partners are typically neutral, the main interactions between them are typically governed by van-der-Waals-forces, which in turn can be derived to good approximation from a Lennard-Jones-potential of the form $$V(r) = 4\varepsilon\left(\left(\frac{\sigma}{r}\right)^{12} - \left(\frac{\sigma}{r}\right)^{6}\right), \qquad (1)$$

where $\varepsilon$ describes the depth of the potential well and $\sigma$ corresponds roughly to the distance from the origin that separates the attractive from the repulsive part of the potential.

Due to the high temperature and correspondingly high velocity of the evaporated atoms, the attractive term of eq. 1, $-/r^{-6}$, can be neglected in first approximation, and the repulsive term $+1/r^{-12}$ can be approximated by a hard sphere potential of the form:

$$V(r) = \begin{cases} \infty & \text{for } 0 \le r \le R \\ 0 & \text{for } r > R, \end{cases} \qquad (2)$$

where R is the radius of the sphere.

Thus, in first approximation, the collisions between two neutral collision partners can be described in terms of two hard spheres with radii $R_1$ and $R_2$ that are colliding.

Figure 15:
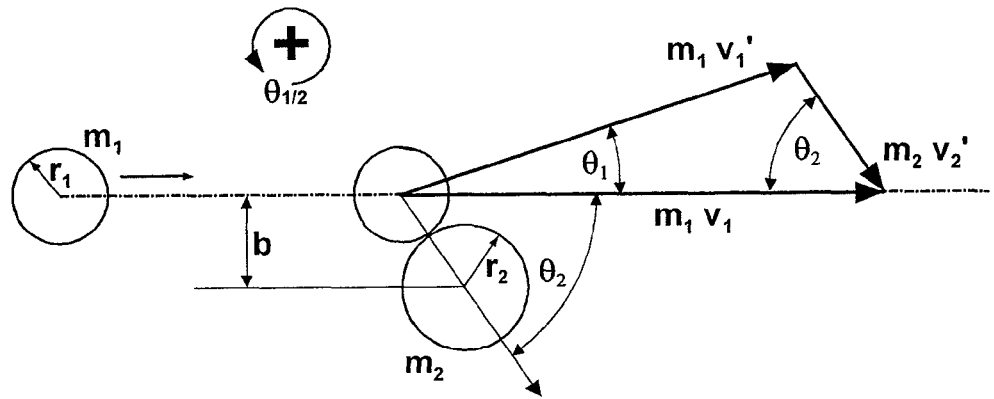
FIG. 15 is a schematic view that depicts the situation for a coordinate system describing the collision of two hard spheres.

FIG. 15 sketches the situation for a coordinate system that is fixed to sphere 2. Thus, in this system, sphere 2 is resting. Sphere 1 is approaching sphere 2 from the left with velocity $v_1$. The collision can be central or non-central, which means that the center of mass of sphere 2 can be located on the trajectory of the moving center of mass of sphere 1 or not. The distance between the center of mass of sphere 2 and the trajectory of sphere 1 is called "collision parameter", b, as sketched in FIG. 15. In the case of the hard sphere potential, eq. 2, the spheres only collide if $b<R_1+R_2$. Otherwise, the spheres do not interact with each other. The collision is governed by the laws of momentum conservation:

$$m_1\vec{v}_1 = m_1\vec{v}_1' + m_2\vec{v}_2', \qquad (3)$$

where $m_1$ and $m_2$ are the masses of sphere 1 and sphere 2, respectively, $v_1$ is the velocity of sphere 1 before, and $v_1'$ and $v_2'$ are the velocities of sphere 1 and sphere 2, respectively, after the collision. Please note that eq. 3 is a vector equation due to the vector character of the velocities. In addition, the law of energy conservation holds $$m_1|\vec{v}_1|^2 = m_1|\vec{v}_1'|^2 + m_2|\vec{v}_2'|^2 + Q_i, \qquad (4)$$

where $Q_i$ is a potential inner excitation, i.e. enery uptake, of the spheres. In the case of $Q_i=0$ the collision is called "elastic", otherwise "inelastic". For the present embodiment, most of the gases used in the examples are single atoms, which cannot be internally excited under the conditions used. However, nitrogen is diatomic, and under the conditions used in the examples below, inner molecular energy levels, such as rotations and vibrations, may be excited, thus rendering the collisions with the evaporated atoms at least to a certain fraction inelastic.

From the momentum conservation law it can be directly seen that the three velocity vectors lie in the same plane. Thus, it is convenient to describe the collision in terms of longitudinal and transversal components of the momenta within this plane, for which the following scalar equations hold independently:

$$m_1 v_1 = m_1 v_1' \cos\theta_1 + m_2 v_2' \cos\theta_2 \qquad (I)$$

$$0 = m_1 v_{11}' \sin\theta_1 + m_2 v_2' \sin\theta_2 \qquad (II) (5)$$

Here, $\theta_1$ and $\theta_2$ are the scattering angles as given in FIG. 15. In the following, the angles are assumed to be positive for counter-clockwise turns. By determining the velocities $v_1'$ and $v_2'$ and the scattering angles $\theta_1$ and $\theta_2$ as a function of the sphere masses, radii, and the initial velocity of sphere 1, $v_1$, the collision is completely described. Equations 4 and 5 provide three independent equations. A fourth equation can be derived for the scattering angle $\theta_2$, which is—in the case of the hard sphere potential—simply a function of the collision parameter b and the sphere radii $R_1$ and $R_2$:

$$\sin\theta_2 = \frac{b}{R_1 + R_2} \text{ for } b < R_1 + R_2 \qquad (6)$$

In the case of elastic scattering, which is the most important case for the present embodiment, combining eqs. 4 ($Q_i=0$) and 5 yields finally $$\cot(\theta_1) = \frac{1}{\sin(2\theta_2)}\left(\cos(2\theta_2) - \frac{m_1}{m_2}\right), \qquad (7)$$

which gives the scattering angle of sphere 1 as a function of the scattering angle of sphere 2 and the ratio of the sphere masses. As can be immediately seen from eq. 7, for $m_1>m_2$, the term in parenthesis is always negative. Further, for symmetry reasons it is sufficient to observe $\theta_2$ in the range $0>\theta_2>-\pi/2$, so that the sine function is always negative, thus rendering the expression on the right hand side of eq. 7>0 in the case of $m_1>m_2$. From this it follows that $0<\theta_1<\pi/2$, i.e. backscattering of the evaporated atoms does not occur if their mass is larger than that of the working gas atoms or molecules.

The maximum scattering angle in the case of forward scattering is a function of the ratio of the masses of the collision partners and—according to eq. 6—of the collision parameter b.

Figure 16:
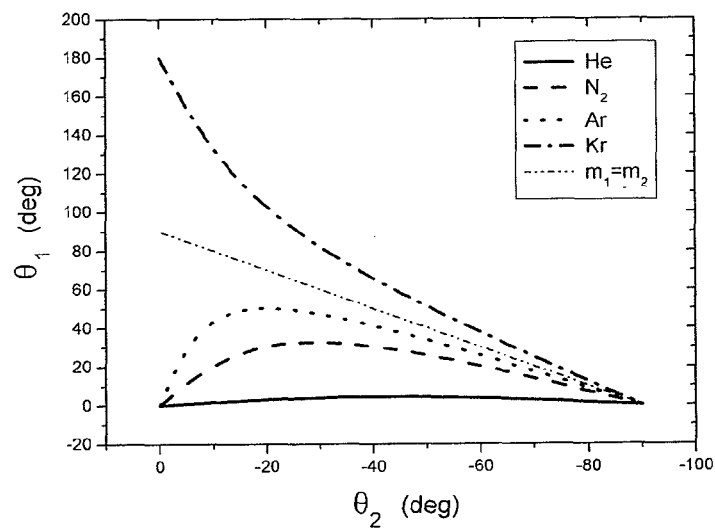
FIG. 16 is a schematic view that depicts the scattering angle $\theta_1$ of the evaporated material as a function of the scattering angle $\theta_2$ of the working gas for chromium as evaporation material and several practicable working gases.

Based on eq. 7, FIG. 16 displays $\theta_1$ as a function of $\theta_2$ for chromium as evaporation material (=sphere 1) and several practicable working gases (=sphere 2). In addition, the special case $m_1=m_2$ is shown for illustration. Note that in the case of Kr the continuous solution of eq. 7 is shown, since the discontinuous solutions are physically meaningless.

A scattering angle of $\theta_2=0$ deg corresponds to the special case of a central collision. Accordingly, depending on the mass ratio, the incoming sphere 1 is either not scattered ($\theta_1=0$) or backscattered by 180 deg. In the cases of $m_1>m_2$, which hold for Cr scattered by He, $N_2$ and Ar, $\theta_1$ runs through a maximum and then declines to 0 deg for $\theta_2=-90$ deg, which corresponds to the case of $b=R_1+R_2$, i.e. the spheres just touch each other. Obviously, the maximum scattering angle depends on the mass ratio and is largest for Ar in the present case. For $m_1=m_2$, the graph illustrates the well-known observation that the spheres depart from the collision point in perpendicular directions to each other.

In the case of Cr evaporation, the maximum scattering angle for the evaporated Cr atoms that can be achieved with the different working gases is approximately given as follows (as determined from FIG. 15):

He: 4.4 deg, $N_2$: 32.6 deg, Ar: 50.2 deg, Kr: 180 deg

Note that also $N_2$ is regarded here as an elastic scatterer, i.e. inner excitations are neglected in the calculation. The results show that when using He as working gas of the present embodiment, a single scattering will not be sufficient to cause a major coating of the shadowed areas of the surface. Heavier gases are therefore potentially more desirable to achieve significant coating of shadowed areas already at lower working gas pressures.

EXAMPLE 2

Number of Collisions Within the Nanostructures

Figure 17:
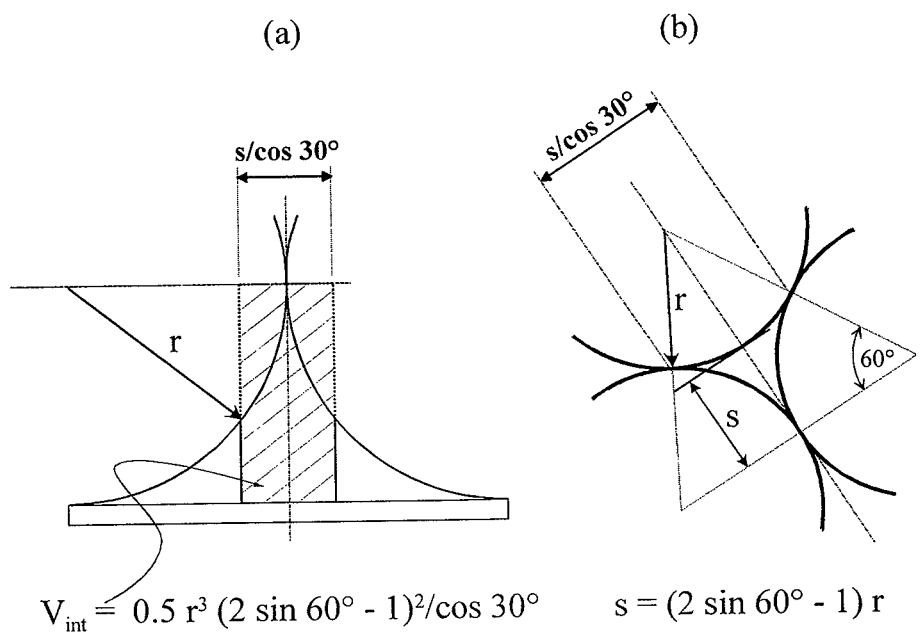
FIG. 17 is a schematic view that depicts the volume $V_{int}$ of an interstice formed in a hexagonally dense-packed mask.

Most important for the present embodiment is a sufficient number of scattering events between working gas and the evaporated material within the free volume of the convex-shaped mask used for structuring. Since this volume decreases with feature size, only nanoscale masks are considered in the following. For example, a substrate is decorated with polystyrene spheres of 500nm diameter. The beads may be packed hexagonally dense or in a random fashion. As shown in FIG. 17, a hexagonally densepacked mask allows the evaporated material to proceed to the surface of the substrate only through small interstices. Accordingly, the volume of these interstices must contain sufficient scatterers to allow the deposition of the evaporated material also underneath shadowed areas of the mask. As illustrated in FIG. 17, the volume $_{Vint}$ of such an interstice can be estimated to $$V_{int}(r) = \frac{1}{2} \frac{(2\sin 60° - 1)^2 r^3}{\cos 30°},$$

where r is the radius of the spheres. In the case of randomly packed sphere masks, a typical void in the mask has the dimension of 4×2 bead diameters. The height is again about one sphere radius r, so that a typical volume in this case is given by $$V_{rand}(r) = 32r3.$$

As mentioned above, the density of the working gas can be described in the relevant pressure regime to good approximation by the ideal gas law. Accordingly, the density of the gas is simply a function of pressure and temperature. For the temperature, we assume that the gas is in equilibrium with the chamber. Note that in the examples given below, the temperature increase during the deposition was always small. The maximum temperature achieved was about 38° C. Tables 2-4 give the density of working gas molecules as a function of pressure for two temperatures as well as the resulting numbers of molecules within interstices and random mask voids for spheres with a diameter of 500 nm. As can be seen from the tables, for random masks there is about one atom of the working gas on average in a void of the given size at a pressure of $1 \times 10^{-4}$ hPa, which thus comprises a lower practicable limit for this case. For hexagonally dense-packed masks, i.e. the deposition within interstices, even at the highest given pressure only 0.5 scatterers are present on average per interstice. Therefore, only a sparse decoration of the shadowed areas can be expected in this case. Note that all numbers given here refer to the example of using 500 nm diameter spheres as convex-shaped mask.

TABLE 2

Density (atoms/m³)

| T (° C.) | p( hPa) | | | | | | | |
|---|---|---|---|---|---|---|---|---|
| | 1.00E−07 | 1.00E−06 | 1.00E−05 | 5.00E−05 | 1.00E−04 | 5.00E−04 | 1.00E−03 | 5.00E−03 |
| 25 | 2.43E+15 | 2.43E+16 | 2.43E+17 | 1.21E+18 | 2.43E+18 | 1.21E+19 | 2.43E+19 | 1.21E+20 |
| 50 | 2.24E+15 | 2.24E+16 | 2.24E+17 | 1.12E+18 | 2.24E+18 | 1.12E+19 | 2.24E+19 | 1.12E+20 |

TABLE 3

Number of atoms/interstice (atoms)

| T (° C.) | p (hPa) | | | | | | | |
|---|---|---|---|---|---|---|---|---|
| | 1.00E−07 | 1.00E−06 | 1.00E−05 | 5.00E−05 | 1.00E−04 | 5.00E−04 | 1.00E−03 | 5.00E−03 |
| 25 | 1.17E−05 | 1.17E−04 | 1.17E−03 | 5.87E−03 | 1.17E−02 | 5.87E−02 | 1.17E−01 | 5.87E−01 |
| 50 | 1.08E−05 | 1.08E−04 | 1.08E−03 | 5.42E−03 | 1.08E−02 | 5.42E−02 | 1.08E−01 | 5.42E−01 |

TABLE 4

| | Number of atoms/random void (atoms) | | | | | | | |
|---|---|---|---|---|---|---|---|---|
| | p (hPa) | | | | | | | |
| T (°C.) | 1.00E−07 | 1.00E−06 | 1.00E−05 | 5.00E−05 | 1.00E−04 | 5.00E−04 | 1.00E−03 | 5.00E−03 |
| 25 | 1.21E−03 | 1.21E−02 | 1.21E−01 | 6.07E−01 | 1.21E+00 | 6.07E+00 | 1.21E+01 | 6.07E+01 |
| 50 | 1.12E−03 | 1.12E−02 | 1.12E−01 | 5.60E−01 | 1.12E+00 | 5.60E+00 | 1.12E+01 | 5.60E+01 |

EXAMPLE 3

Effect of Type of Working Gas

Condition: working gas pressure ~1×10$^{-3}$ hPa

Gases used: He (purity>99.95%), $N_2$ (purity>99.998%), Ar (purity>99.99%), Kr (purity>99.999%)

Pressure calibration: According to manufacturer's instructions (BocEdwards, UK, CP25 Penning Gauge Instruction Manual) and/or the book on vacuum techniques "Wutz Handbuch Vakuumtechnik", ed. K. Jousten, Vieweg Verlag, Wiesbaden, Germany, 2004, the following gas calibration factors for the Penning gauge were used: He: 0.18, $N_2$: 1.0, Ar: 1.4, Kr: 1.83. The true pressure can be then calculated from the meter reading of the Penning gauge as:

(True pressure)=(Meter reading)/(gas calibration factor)

Substrate: Silicon wafer pieces

Colloidal mask (convex particles): polystyrene beads of 500 nm diameter deposited via drying of diluted suspensions on ozone-cleaned Si wafer pieces. This procedure yields high as well as low density areas of particles on the surface. For the example given here, single beads on the surface in areas of sparse bead decoration were analyzed.

Metal-deposition: 20 nm of Cr on top of colloidal mask
Mask removal: 5 min ultrasonication in pure chloroform
Analysis: Hitachi Scanning Electron Microscope S-4200

Figure 18:
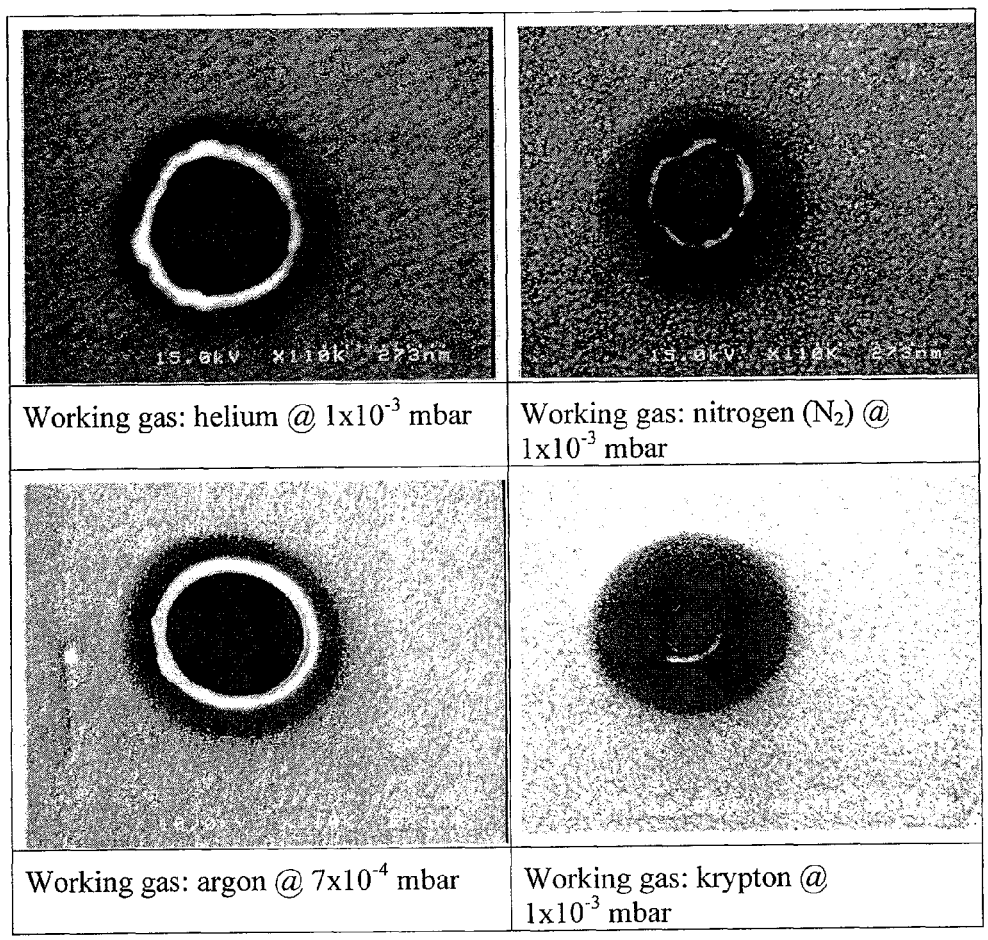
FIG. 18 shows scanning electron microscopy (SEM) images on the effect of type of gas for gas-assisted evaporation at ~$1\times10^{-3}$ hPa.

FIG. 18 displays typical structures formed with single 500 nm polystyrene beads by use of the different working gases in the pressure range of ~10$^{-3}$ hPa. At this relatively high pressure, the formation of a ring structure can be observed surrounding a central hole with no deposition. Surrounding the ring structure is a well area of increasing thickness in radial direction from the immediate vicinity of the ring, where it is lowest, to the deposition height of the metal on the free surface. The diameter of this region can be associated with the original bead diameter.

Depending on the gas used for deposition, the following general observations can be made:

i) The quality of the ring structure varies in terms of circularity and homogeneity
ii) The diameter of the ring structure varies Argon yields ring structures of best quality and with a rather large diameter. Krypton, in contrast yields structures of acceptable quality, however, with a rather small diameter. Nitrogen-assisted structures form structures of intermediate diameter and mostly lower quality. Helium-assisted structures are similar to those of the argon-assisted ones, however, of lower quality than the former ones.

These types of structures can be found all over the surface of the samples.

As a measure of the differences achieved by use of the different gases, Table 5 gives the ratios between inner ring diameter (i.e. the deposition-free center) to outer bead diameter (i.e. diameter of the blackened round-shaped area, which is supposed to represent the former bead size) for the four images shown in FIG. 18. To account for the deviations from circularity, the diameters were measured in horizontal and vertical direction and then averaged.

TABLE 5

| | Inner Ring Diameter (nm) | | | Outer Bead Diameter (nm) | | | |
|---|---|---|---|---|---|---|---|
| Gas | vertical | horizontal | MEAN | vertical | horizontal | MEAN | Ratio |
| He | 318.5 | 318.5 | 318.5 | 491.4 | 500.5 | 496.0 | 0.64 |
| $N_2$ | 218.4 | 195.7 | 207.0 | 445.9 | 464.1 | 455.0 | 0.46 |
| Ar | 273.0 | 300.3 | 286.7 | 450.5 | 482.3 | 466.4 | 0.61 |
| Kr | 109.2 | 118.3 | 113.8 | 409.5 | 455.0 | 432.3 | 0.26 |

As can already be seen by the naked eye, argon and helium have a rather similar ratio of ring and particle diameters, while krypton gives the smallest value and nitrogen is in-between.

As outlined in example 1, the differences in the structures formed are potentially caused by the differences in the physical properties of the gases. For example, krypton is heavier than chromium, so that a collision between Kr and Cr may cause backscattering of the Cr atom. Therefore, by use of Kr, the distribution of scattering angles is probably shifted to higher values as compared to other the other gases, resulting in this "deep underfilling" of the beads. Argon, in contrast, has an atomic weight close to that of chromium, thus rendering it a very efficient scatterer. Nitrogen, on the other hand, has a special role, because it is a diatomic molecule and therefore is able to undergo some inner excitations, such as rotations and vibrations. Accordingly, it might cause inelastic scattering in addition to elastic scattering, which might further influence the distribution of scattering angles.

Figure 19:
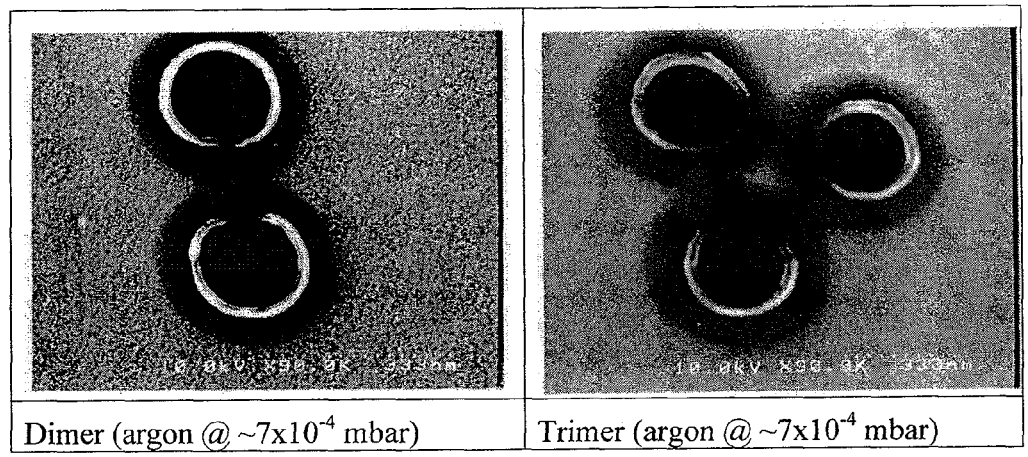
FIG. 19 shows structures formed with small clusters of polystyrene beads as template and argon as working gas at a working pressure of $7\times10^{-4}$ hPa.

Examples on ring structures of high quality that can be formed with small bead clusters by using argon are displayed in FIG. 19.

EXAMPLE 4

Effect of Working Gas Pressure

Condition: working gas pressure varied from 1×10$^{-5}$ to 1×10$^{-3}$ hPa

Gases used: He (purity>99.95%), $N_2$ (purity>99.998%), Ar (purity>99.99%), Kr (purity>99.999%)

Gas calibration factors: He: 0.18, $N_2$: 1.0, Ar: 1.4, Kr: 1.83. The true pressure can be then calculated from the meter reading of the Penning gauge as:

(True pressure)=(Meter reading)/(gas calibration factor)

Substrate: Silicon wafer pieces

Colloidal mask (convex particles): polystyrene beads of 500 nm diameter deposited via drying of diluted suspensions on ozone-cleaned Si wafer pieces. This procedure yields high as well as low density areas of particles on the surface. For the example given here, isolated beads as well as areas of rather dense packing were analyzed.

Metal-deposition: 20 nm of Cr on top of colloidal mask
Mask removal: 5 min ultrasonication in pure chloroform
Analysis: Hitachi Scanning Electron Microsope S-4200

Figure 20:
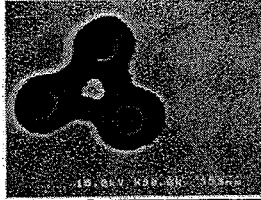
FIG. 20 shows the effect of different gas working pressures and two different working gases on the structures that can be formed with small clusters of polystyrene beads as template.
Figure 20:
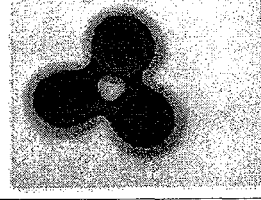
Figure 20:
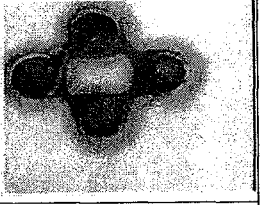
Figure 20:
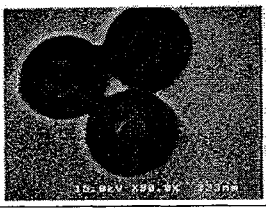
Figure 20:
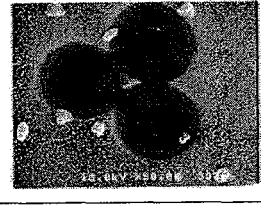
Figure 20:
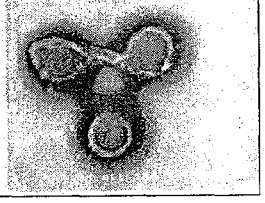

The effect of evaporating at different gas pressures can be observed from isolated beads, such as shown in FIGS. 18 and 19 as well as from larger bead aggregates. FIG. 20 displays some examples obtained with isolated, small clusters.

At the lowest pressures shown ($10^{-4}$ hPa for $N_2$ and $10^{-5}$ hPa for He) the effect of gas is negligible. This can be seen from the sharp edges at the former bead positions, which are due to a pronounced shadowing effect. The vague circles discernible in the center of the particles are most likely due to residual polymer, which had not been completely removed during the ultrasonic bead removal in chloroform as confirmed in later control experiments. At a pressure of $5\times10^{-4}$ hPa, both gases result in very nice well structures with oblique walls. At $1\times10^{-3}$ hPa, the ring structures already discussed above have formed.

It must be particularly mentioned that it may be wanted to avoid the formation of ring structures, in particular if the conditions for their formation are not optimized. However, using classical Ar sputtering is typically performed at a pressure of $1\times10^{-3}$ hPa and above to fulfill the required plasma discharge condition. In such case the formation of ring structures cannot be avoided. For example, Aizpurua and coworkers reported of the formation of such structures when applying Ar plasma sputtering (J. Aizpurua et al., Phys. Rev. Lett., Vol. 90, pp. 057401/1-4, 2003). Our results clearly indicate that with the method of gas-assisted evaporation, where no plasma discharge condition needs to be met, the problem of ring formation can be avoided.

Figure 21:
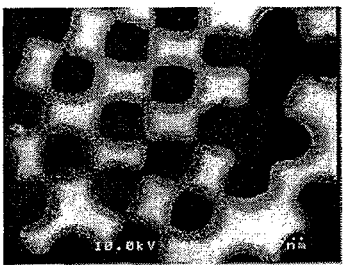
FIG. 21 shows the effect of different gas working pressures and two different working gases on the structures that can be formed with large and rather dense-packed assemblies of polystyrene beads as template.
Figure 21:
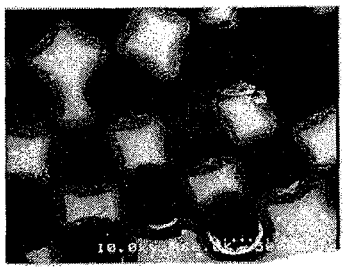
Figure 21:
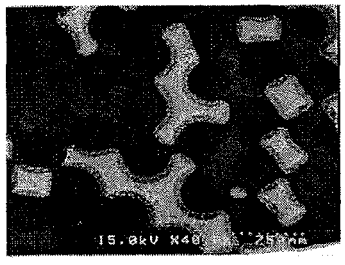
Figure 21:
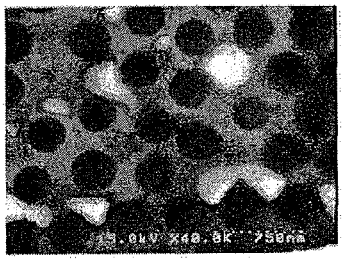
Figure 21:
Figure 21:
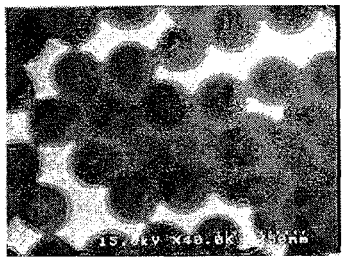
Figure 21:
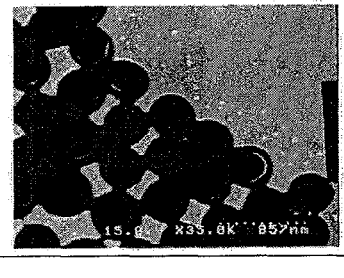
Figure 21:
Figure 22:
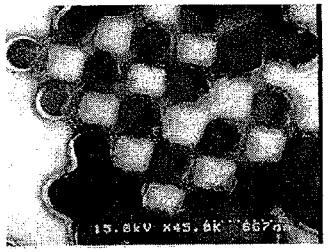
FIG. 22 shows the effect of different gas working pressures and the other two different working gases on the structures that can be formed with large and rather dense-packed assemblies of polystyrene beads as template.
Figure 22:
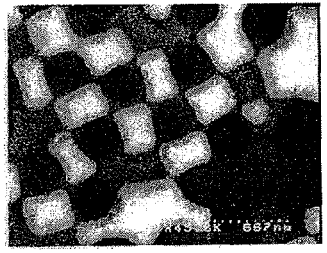
Figure 22:
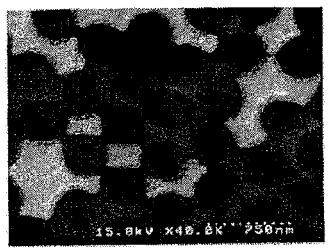
Figure 22:
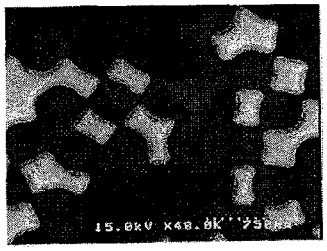
Figure 22:
Figure 22:
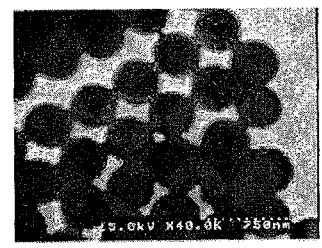
Figure 22:
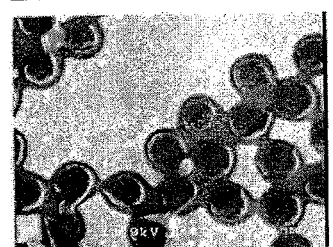
Figure 22:
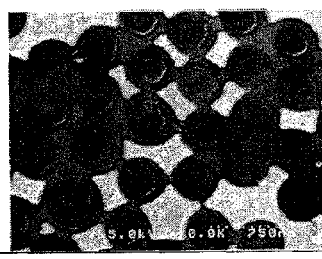

The situation changes in case of deposition onto dense-packed particle layers. The reason is simple. The shadowed parts of the free surface underneath the beads is partially shielded by neighboring particles, accordingly reducing the flux of metal atoms moving underneath the beads under high scattering angles. Accordingly, even at high pressures the formation of ring structures is hardly observable in these cases, except for the rim of the aggregate, where the outmost beads experience the same conditions as an isolated bead or small cluster. Nevertheless, pressure- and gas-dependent differences are observable, as shown in FIGS. 21 and 22, which displays the structures obtained after deposition of 20 nm of Cr onto dense-packed colloidal masks and subsequent mask removal for four gases utilized at four different working pressures.

As can be seen from the figure, the structures are not affected by the presence of the working gas at the lowest pressure, i.e. reveal a pronounced shadowing effect, but show the formation of discernible mesh structures when the pressure is increased. At the highest pressure used, the mesh structures dominate and a significant softening of the structure edges can be observed due to metal deposition underneath the formerly present beads. Most interestingly, the use of krypton exhibits once more the most oblique and extended edges. In particular, it is remarkable that in this latter case the edges of the individual structures contact each other forming a connected mesh. Under the conditions used, this effect is not observable to same extent when using the other gases.

One additional observation can be made. While the lowest pressure does not cause the formation of any mesh structures or yield a significant softening of the structure edges, a partial ring formation around the former contact points of the beads with the substrate is discernible, in particular when using nitrogen. This effect may be related to the large mean free path of the chromium atoms between two subsequent scattering events of the same atom at this low pressure.

EXAMPLE 5

Structure Formation on Colloidal Mask

Condition: working gas pressure varied from $1\times10^{-5}$ to $1\times10^{-3}$ hPa Gases used: He (purity>99.95%), $N_2$ (purity>99.998%), Ar (purity>99.99%), Kr (purity>99.999%)

Gas calibration factors: He: 0.18, $N_2$: 1.0, Ar: 1.4, Kr: 1.83. The true pressure can be then calculated from the meter reading of the Penning gauge as:

(True pressure)=(Meter reading)/(gas calibration factor)

Substrate: Silicon wafer pieces

Colloidal mask (convex particles): polystyrene beads of 500 nm diameter deposited via drying of diluted suspensions on ozone-cleaned Si wafer pieces. This procedure yields high as well as low density areas of particles on the surface. For the example given here, areas of rather dense packing were analyzed.

Metal-deposition: 20 nm of Cr on top of colloidal mask
Mask removal: no mask removal
Analysis: Hitachi Scanning Electron Microsope S-4200

Figure 23:
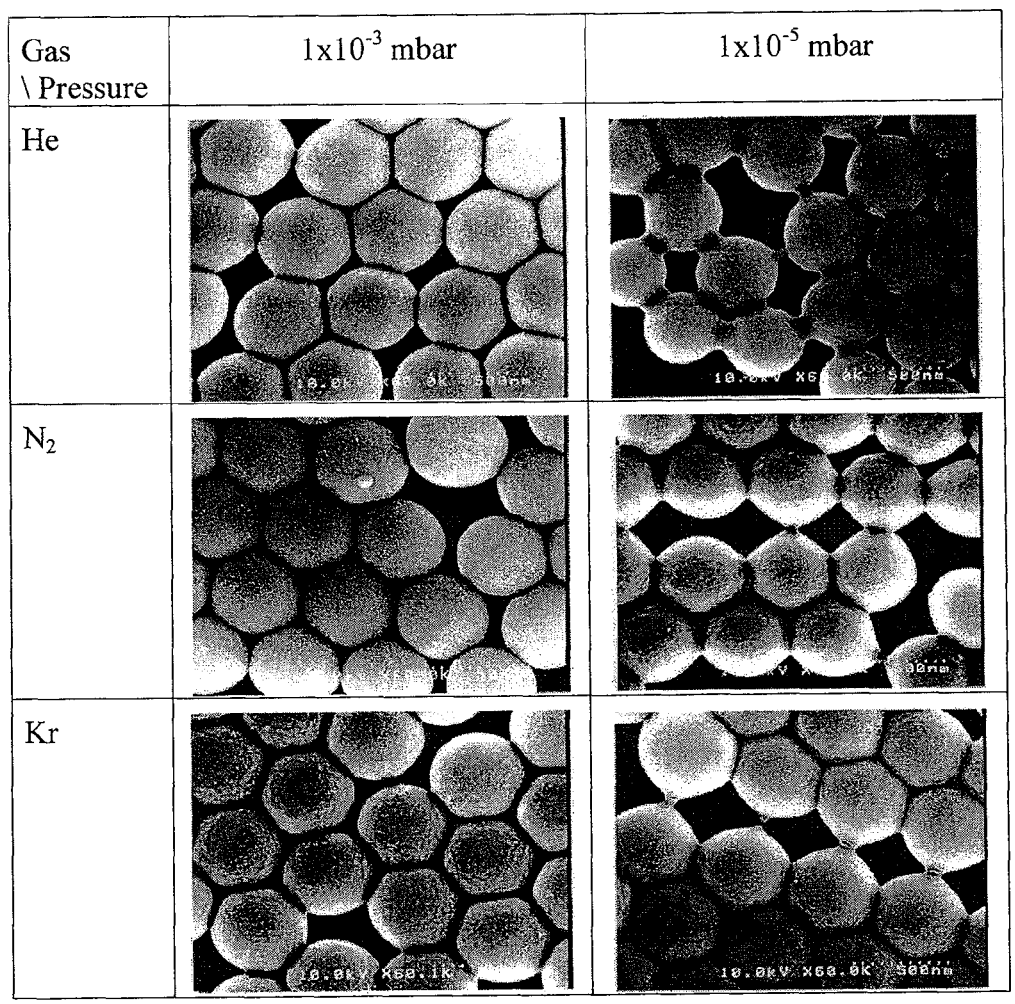
FIG. 23 shows the structures that can be formed on the colloidal mask.

The samples were also studied after metal deposition but prior to mask removal. Also in this stage some interesting observations could be made as exemplified in FIG. 23.

As can be seen from the Figure, the use of different gases and working pressures causes metal deposition onto the colloidal mask in different ways. Partially, the effects are opposing. For example, the contact points are significantly filled with material forming an interconnecting metal grid at low pressures for He and $N_2$, but in contrast at high pressure for Kr. In particular the structures formed at low pressure by use of He appear interesting, because all beads are interconnected, while the interstices form clearly visible open apertures, which is not discernible to this extent in the other cases. Further, particularly in the case of low pressures, the formation of wire-like interconnections between slightly displaced neighboring beads can be observed. The reasons why this happens particularly at low pressures are so far unclear, but might be possibly related to the longer free mean path of the metal atoms in this case. Besides nicely formed interconnections, the image in the lower right of FIG. 23 (Kr@$1\times10^{-5}$ hPa) further shows an example of a broken wire connection, probably due to the built-up of excessive mechanical stress, e.g. during the cooling down of the sample. This broken wire resembles a nanoscale electrode pair, which might be interesting in the future for multiple applications, e.g. in nanoelectronics, nanooptics, nanoplasmonics, (nano-)biosensing, electrochemistry, microfluidics, (nano)-biochemistry, (nano-) (bio-)chemical synthesis, nano-biotechnology, and related art.

EXAMPLE 6

Effect of the Evaporated Source Material

Condition: working gas pressure $5\times10^{-4}$ mbar
Gases used: Ar (purity>99.99%), Kr (purity>99.999%)
Pressure calibration: as above: Ar: 1.4, Kr: 1.83
Substrate: Silicon wafer pieces
Colloidal mask (convex particles): polystyrene beads of 500 nm diameter deposited via drying of diluted suspensions on ozone-cleaned Si wafer pieces. This procedure yields high as well as low density areas of particles on the surface. For the example given here, single beads, small clusters, as well as areas of rather dense packing were analyzed.

Metal-deposition: 30 nm of Ag on top of colloidal mask
Mask removal: 5 min ultrasonication in pure chloroform
Analysis: Hitachi Scanning Electron Microscope S-4200

In this example, silver is used instead of chromium as evaporation material. According to example 1, the maximum scattering angle of an evaporated atom 1 colliding with a working gas atom or molecule 2 depends on the mass ratio $m_1/m_2$ (cf eq. 7), so that changing this ratio might yield a different deposition underneath the convex-shaped mask. Of the working gases used, only Kr has a mass larger than Cr, so that only in that case backscattering of Cr atoms is possible. Ag, however, with its molecular weight of 107.87 g/mol is heavier than Kr, thus causing forward scattering also in this case. In fact, $m_{Ag}/m_{Kr}=1.29$, which is very close to $m_{Cr}/m_{Ar}=1.30$, so that a direct comparison of the resultant structures might give insight into the validity of eq. 7.

Figure 24:
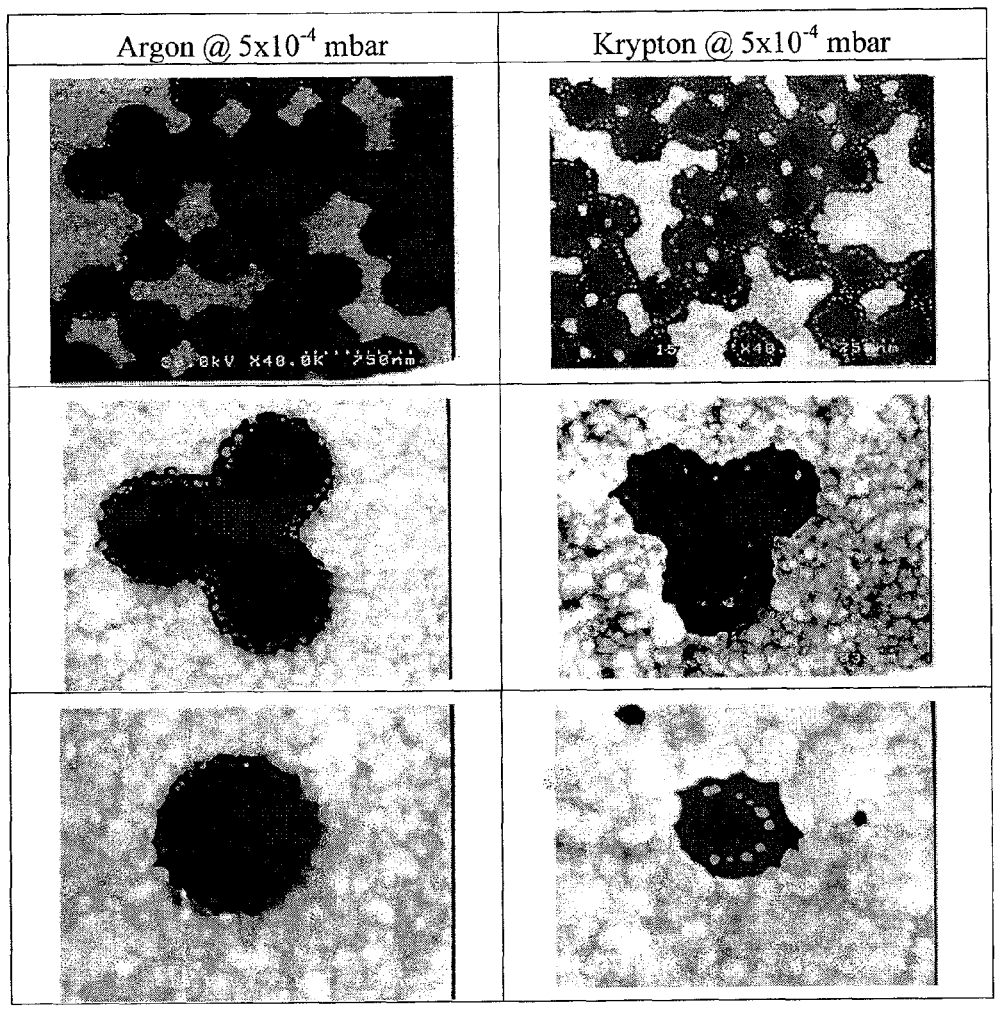
FIG. 24 displays structures obtained with silver evaporated onto a colloidal mask of 500 nm polystyrene beads adsorbed on silicon wafer pieces.

FIG. 24 displays structures obtained with silver evaporated onto a colloidal mask of 500 nm polystyrene beads adsorbed on silicon wafer pieces. Silver has a weaker adhesion to the $SiO_2$ of the wafer surface, so that potentially some of the features have been removed during the ultrasonication used for removal of the colloidal mask. Also, silver is more susceptible to re-crystallization and as can be seen from the SEM images, rather large grains have formed, thereby modifying the nanostructures in particular at the borders. Nevertheless, the formation of ring structures underneath the formerly present colloidal particles is clearly discernible. Obviously, in the case of Ar these ring structures form very close to the border marking the direct evaporation, i.e. exposure to the deposited material, while they form closer to the center of the former bead positions when using Kr. An evaluation of the single bead images of FIG. 24, which determines the ratio "ring diameter/bead diameter" as earlier performed in example 3, yields a ratio of 0.90 in the case of Ar and of 0.69 in the case of Kr. The latter value is in good agreement with that found for the Cr/Ar combination, which gave 0.61 (cf Example 3) with a similar mass ratio, thus confirming the validity of eq. 7.

The mass ratio $m_1/m_2$ therefore can be used to influence the nanostructures formed by means of the present embodiment.

EXAMPLE 7

Effect of the Deposition Rate of the Evaporated Source Material

Condition: working gas pressure $3.6\times10^{-4}$ mbar
Gases used: Ar (purity>99.99%)
Pressure calibration: as above: Ar: 1.4
Substrate: Silicon wafer pieces
Colloidal mask (convex particles): polystyrene beads of 500 nm diameter deposited via drying of diluted suspensions on ozone-cleaned Si wafer pieces. This procedure yields high as well as low density areas of particles on the surface. For the example given here, single beads and areas of rather dense packing were analyzed.

Metal-deposition: 20 nm of Cr on top of colloidal mask at three different rates of a) 0.05 nm/s, b) 0.15 nm/s, and c) 0.3 nm/s
Mask removal: 5 min ultrasonication in pure chloroform
Analysis: Hitachi Scanning Electron Microscope S-4200

Figure 25:
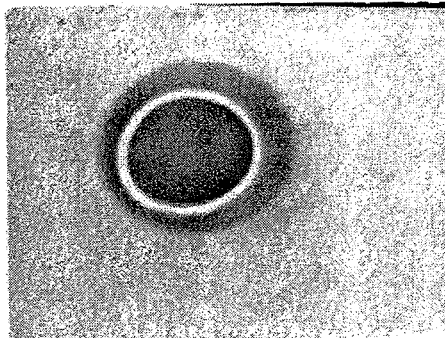
FIG. 25 shows the structures obtained with three different deposition rates.
Figure 25:
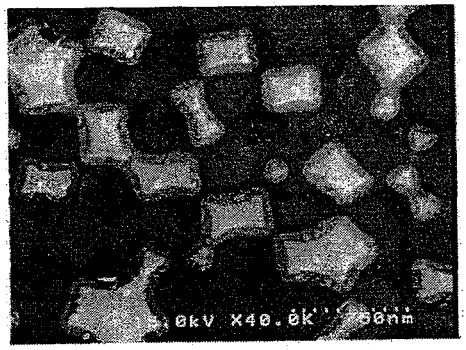
Figure 25:
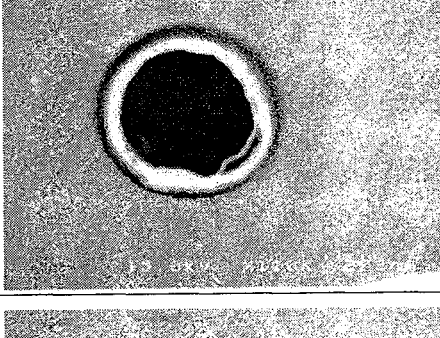
Figure 25:
Figure 25:
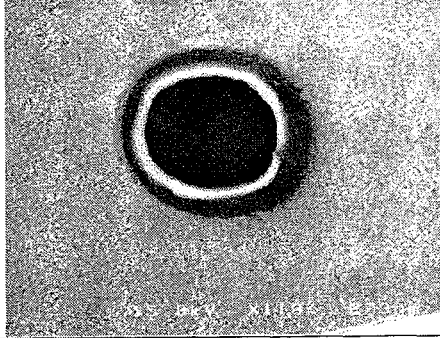
Figure 25:
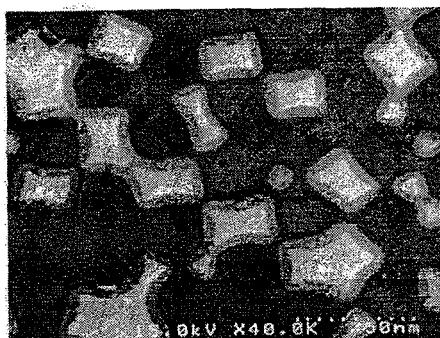

In this example, the effect of the deposition rate on the resulting structures is studied. Three different deposition rates have been chosen, all other parameters were kept constant at the values used in the previous examples. FIG. 25 compares the structures obtained. As can be seen, the ring structures achieved look quite similar. Also, in areas of dense particle packing (right hand side of FIG. 25), the slope of the walls formed seems to be basically the same. Some minor differences are probably due to sample-to-sample variations. Thus, in the range studied here, the deposition rate has no significant influence on the small structures formed by means of the present embodiment. This can be expected as long as collisions between evaporated atoms and working gas molecules are dominant and collisions among evaporated atoms can be neglected.

Heretofore, the present invention is explained with reference to the embodiments. However, various changes or improvements can be applied to the embodiments.

The invention claimed is:

1. A method for producing nanopatterns or micropatterns comprising:
    depositing a mask on a surface of a substrate;
    disposing the substrate in a chamber;
    introducing an inert gas and a source material into the chamber such that the inert gas and the vaporized source material are present in the chamber at the same time,
    evaporating the source material under such evaporation condition performed at such pressure to scatter atoms of the source material by collision with the inert gas and to form a layer onto both a shadowed surface area and a non-shadowed surface area of the mask and the substrate, wherein
    the non-shadowed surface area is an area on the substrate and the mask in the deposition process having a direct line of sight with the source of evaporation,
    the shadowed surface area is an area on the substrate and the mask in the deposition process, which does not have a direct line of sight with the source of evaporation, and
    the pressure is on or above $1\times10^{-5}$ hPa and below $1\times10^{-3}$ hPa.

2. The method according to claim 1, wherein
    a first source material is evaporated in the chamber under a first evaporation condition performed at a first pressure to form a first layer of the first source material; and
    a second source material is evaporated in the chamber under a second evaporation condition performed at a second pressure which is different from the first pressure to form a second layer of the second source material, and
    the lower pressure is applied to the first evaporation or the second evaporation to form a layer onto the non-shadowed surface area of the mask and the substrate; and the higher pressure is applied to the first evaporation or the second evaporation to form a layer onto both the shadowed surface area and the non-shadowed surface area of the mask and the substrate.

3. The method according to claim 2,
    wherein the first source material is evaporated at the higher pressure to form the first layer onto both the shadowed surface area and the non-shadowed surface area of the mask and the substrate; and the second source material is evaporated at the lower pressure to form the second layer onto the non-shadowed surface area of the mask and the substrate.

4. The method according to claim 3, further comprising:

evaporating a third source material at the higher pressure to form a third layer of the third source material onto both the shadowed surface area and the non-shadowed surface area of the mask and the substrate.

5. The method according to claim 4, further comprising:

removing the mask with the first layer, the second layer and the third layer formed onto the mask from the surface of the substrate to remain the first layer, the second layer and the third layer formed onto the surface of the substrate.

6. The method according to claim 5, further comprising:

placing a host material onto the surface of the substrate to cover the third layer; and removing the substrate from the host material to expose the first layer and the mask remained on the host material to the outside of the host material.

7. The method according to claim 6, further comprising:

removing the mask from the host material to expose the first layer remained on the host material to the outside of the host material.

8. The method according to claim 3, further comprising:

removing the mask with the first layer and the second layer formed onto the mask from the substrate to expose the first layer and the second layer remained on the surface of the substrate.

9. The method according to claim 8, further comprising:

placing a host material onto the surface of the substrate to cover the first layer and the second layer remained on the surface of the substrate; and removing the substrate from the host material to expose the first layer remained on the host material to the outside of the host material.

10. The method according to claim 2, wherein the first source material is evaporated at the lower pressure to form the first layer onto the non-shadowed surface area of the mask and the substrate; and the second source material is evaporated at the higher pressure to form the second layer onto both the shadowed surface area and the non-shadowed surface area of the mask and the substrate.

11. The method according to claim 10, further comprising:

placing a host material onto the surface of the substrate to cover the second layer formed onto the mask; and removing the substrate from the host material to expose the first layer and the second layer remained on the host material to the outside of the host material.

12. The method according to claim 11, further comprising:

removing the mask from the substrate to expose the first layer and the second layer remained on the host material to the outside of the host material.

13. The method according to claim 10, further comprising:

removing the mask with the first layer and the second layer formed onto the mask from the substrate;

placing a host material onto the surface of the substrate to cover the first layer and the second layer remained on the surface of the substrate; and removing the substrate from the host material to expose the first layer and the second layer remained on the host material to the outside of the host material.

14. The method according to claim 2, wherein the higher pressure is applied by introducing the inert gas into the chamber in which the substrate is disposed.

15. The method according to claim 14, wherein the inert gas is nitrogen gas.

16. The method according to claim 2, further comprising: evaporating one or more source materials which may be the same or different from the said first source material or the second source material under the said first or second evaporation condition.

17. The method according to claim 2, wherein the mask is a colloidal mask having microscopic particles with a convex shape.

18. The method according to claim 1, wherein the pressure is applied by introducing the inert gas into the chamber in which the substrate is disposed.

19. The method according to claim 18, wherein the inert gas is Argon gas or Krypton gas.

20. The method according to claim 18, wherein the pressure is on or under about $5\times10^{-4}$ hPa.

21. The method according to claim 1, wherein the mask is a colloidal mask having microscopic particles with a convex shape.

* * * * *